US012721152B2

(12) United States Patent
Chuang

(10) Patent No.: US 12,721,152 B2
(45) Date of Patent: Aug. 25, 2026

(54) SEMICONDUCTOR DEVICE AND METHOD FOR FABRICATING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 402 days.

(21) Appl. No.: 18/531,977

(22) Filed: Dec. 7, 2023

(65) Prior Publication Data

US 2025/0192038 A1 Jun. 12, 2025

(51) Int. Cl.
*H01L 23/528* (2006.01)
*H10B 12/00* (2023.01)
(Continued)

(52) U.S. Cl.
CPC ........ *H10W 20/435* (2026.01); *H10B 12/053* (2023.02); *H10B 12/34* (2023.02);
(Continued)

(58) Field of Classification Search
CPC .... H10B 12/053; H10B 12/34; H10B 12/488; H10W 20/033; H10W 20/056;
(Continued)

(56) References Cited

U.S. PATENT DOCUMENTS

2023/0301079 A1* 9/2023 Yanai .................... H10B 41/27
257/314
2025/0072089 A1* 2/2025 Chuang ................ H10D 64/513
(Continued)

FOREIGN PATENT DOCUMENTS

TW 202339116 A 10/2023

OTHER PUBLICATIONS

Office Action and and the search report mailed on Aug. 19, 2025 related to Taiwanese Application No. 113106120.
(Continued)

*Primary Examiner* — Jaehwan Oh
(74) *Attorney, Agent, or Firm* — Xuan Zhang

(57) ABSTRACT

The present application discloses a semiconductor device and a method for fabricating the semiconductor device. The semiconductor device includes a substrate; and a first word line structure including a first word line dielectric layer positioned in the substrate and including a U-shaped cross-sectional profile, a first bottom conductive layer positioned on the first word line dielectric layer and laterally surrounded by the first word line dielectric layer, a first top conductive layer positioned on the first bottom conductive layer and laterally surrounded by the first word line dielectric layer, and a first capping layer including a bottom portion positioned penetrating through the first top conductive layer and extending to the first bottom conductive layer, and a top portion positioned on the bottom portion and laterally surrounded by the first word line dielectric layer.

12 Claims, 20 Drawing Sheets

(51) Int. Cl.
*H10W 20/00* (2026.01)
*H10W 20/41* (2026.01)
*H10W 20/48* (2026.01)

(52) U.S. Cl.
CPC ....... *H10W 20/033* (2026.01); *H10W 20/056* (2026.01); *H10W 20/062* (2026.01); *H10W 20/425* (2026.01); *H10W 20/48* (2026.01)

(58) Field of Classification Search
CPC ............. H10W 20/062; H10W 20/425; H10W 20/435; H10W 20/48
See application file for complete search history.

(56) References Cited

U.S. PATENT DOCUMENTS

| | | | | |
|---|---|---|---|---|
| 2025/0118664 | A1* | 4/2025 | Wu | H10W 20/435 |
| 2025/0192043 | A1* | 6/2025 | Chuang | H10W 20/056 |
| 2025/0194079 | A1* | 6/2025 | Chuang | H10B 12/053 |

OTHER PUBLICATIONS

Office Action and and the search report mailed on Aug. 20, 2025 related to Taiwanese Application No. 113121197.
Summary translations of Office Actions and and the search reports Aug. 19, 2025 related to Taiwanese Application No. 113106120 and Aug. 20, 2025 related to Taiwanese Application No. 113121197.

* cited by examiner

10

S11 Providing a substrate, forming an isolation layer in the substrate to define an active area, forming a plurality of first trenches in the active area and a plurality of second trenches in the isolation layer S13 Conformally forming a layer of first dielectric material in the plurality of first trenches and the plurality of second trenches, forming a plurality of first bottom conductive layers and a plurality of second bottom conductive layers on the layer of first dielectric material, and forming a plurality of first top conductive layers and a plurality of second top conductive layers on the plurality of first bottom conductive layers and the plurality of second bottom conductive layers S15 Forming a plurality of first spacers on the plurality of first top conductive layers, resulting in a plurality of first inner trenches, and forming a plurality of second spacers on the plurality of second top conductive layers, resulting in a plurality of second inner trenches S17 Deepening the plurality of first inner trenches and the plurality of second inner trenches to form a plurality of first extended inner trenches and a plurality of second extended inner trenches, which partially expose the plurality of first bottom conductive layers and the plurality of second bottom conductive layers S19 Completely filling the plurality of first trenches and the plurality of second trenches to form a plurality of first capping layers and a plurality of second capping layers

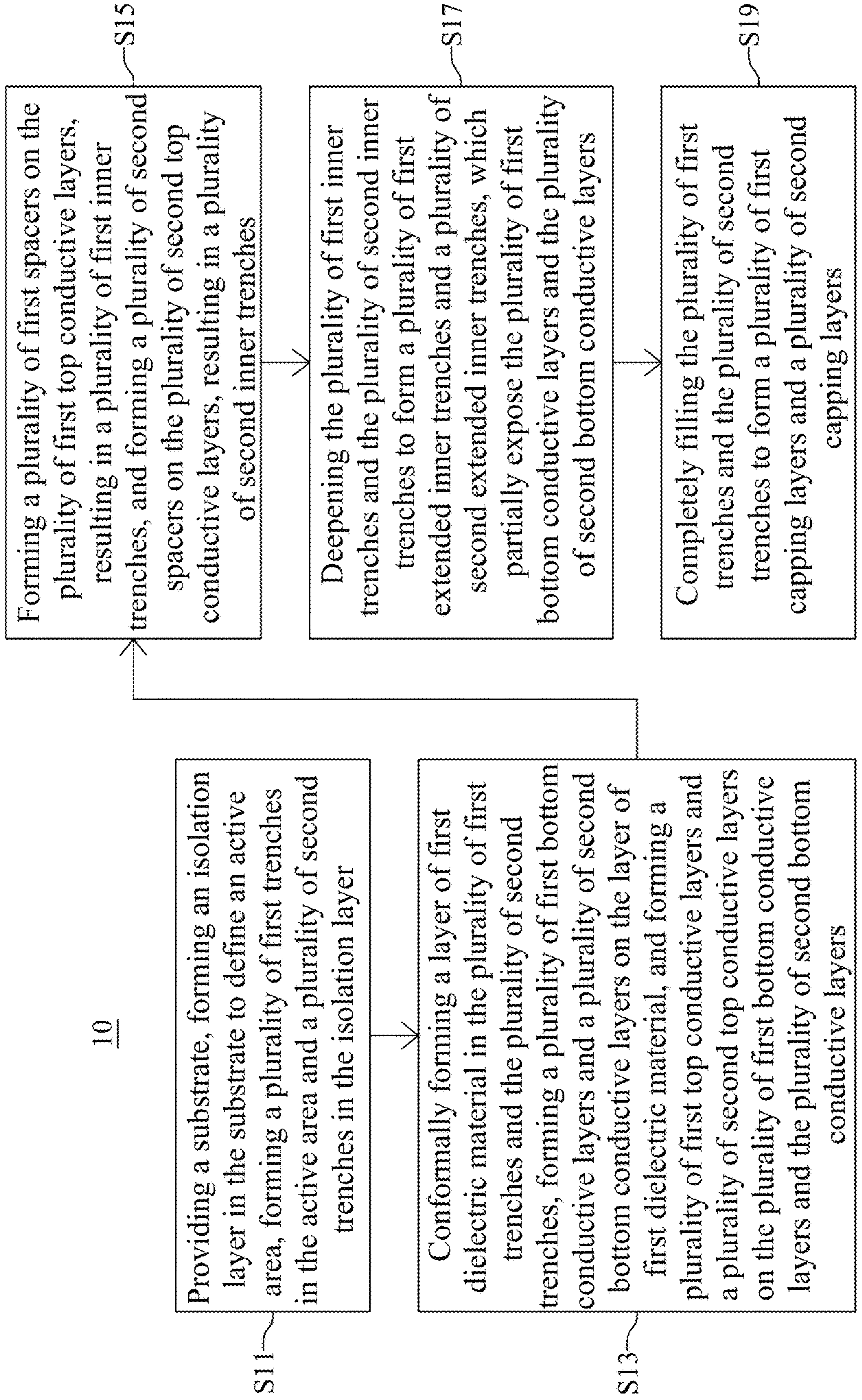

FIG. 1

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with bottom and top conductive layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; and a first word line structure including a first word line dielectric layer positioned in the substrate and including a U-shaped cross-sectional profile, a first bottom conductive layer positioned on the first word line dielectric layer and laterally surrounded by the first word line dielectric layer, a first top conductive layer positioned on the first bottom conductive layer and laterally surrounded by the first word line dielectric layer, and a first capping layer including a bottom portion positioned penetrating through the first top conductive layer and extending to the first bottom conductive layer, and a top portion positioned on the bottom portion and laterally surrounded by the first word line dielectric layer.

Another aspect of the present disclosure provides a semiconductor device including a substrate; a first word line dielectric layer positioned in the substrate and including a U-shaped cross-sectional profile; a first bottom conductive layer positioned on the first word line dielectric layer and laterally surrounded by the first word line dielectric layer; a first top conductive layer positioned on the first bottom conductive layer and laterally surrounded by the first word line dielectric layer; a first capping layer positioned penetrating the first top conductive layer and extending to the first bottom conductive layer; and a plurality of first spacers positioned on the first top conductive layer and laterally surrounding the first capping layer. The first word line dielectric layer, the first bottom conductive layer, the first top conductive layer, and the first capping layer together configure a first word line structure.

Another aspect of the present disclosure provides a method for fabricating a semiconductor device including providing a substrate and forming a first trench in the substrate, and conformally forming a layer of first dielectric material in the first trench; forming a first bottom conductive layer on the layer of first dielectric material and within the first trench, and forming a first top conductive layer on the first bottom conductive layer and within the first trench; conformally forming a layer of spacer material on the first top conductive layer and the layer of first dielectric material; performing a punch-through process to turn the layer of spacer material into a plurality of first spacers attached to the layer of first dielectric material, resulting in a first inner trench, which separates the plurality of first spacers and partially exposes the first top conductive layer; deepening the first inner trench to form a first extended inner trench that penetrates the first top conductive layer and extends to the first bottom conductive layer; removing the plurality of first spacers and forming a layer of capping material to completely fill the first trench; and performing a planarization process to turn the layer of first dielectric material into a first word line dielectric layer and turn the layer of capping material into a first capping layer. The first word line dielectric layer, the first bottom conductive layer, the first top conductive layer, and the first capping layer together configure a first word line structure.

Due to the design of the semiconductor device of the present disclosure, issues such as line end wiggling may be mitigated by substituting sections of the first top conductive layer with the bottom portion of the first capping layer. Additionally, gate-induced drain leakage may be minimized by utilizing the first bottom conductive layer and the first top conductive layer composed of materials with differing work functions.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

DETAILED DESCRIPTION

Figure 2:
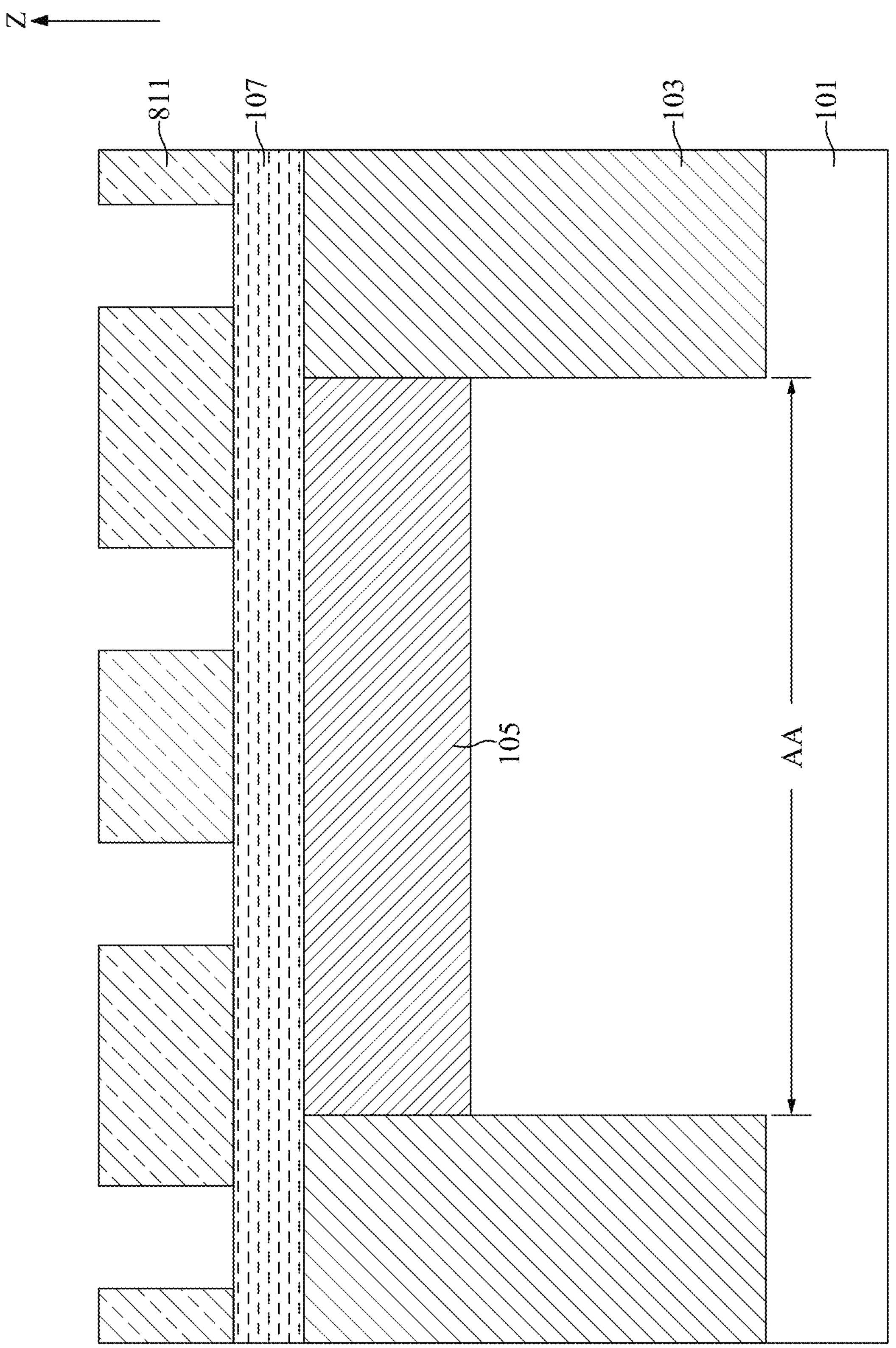
FIGS. 2 to 16 illustrate, in schematic cross-sectional view diagrams, a flow for fabricating the semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 16 illustrate, in schematic cross-sectional view diagrams, a flow for fabricating the semiconductor device 1A in accordance with one embodiment of the present disclosure.

Figure 3:
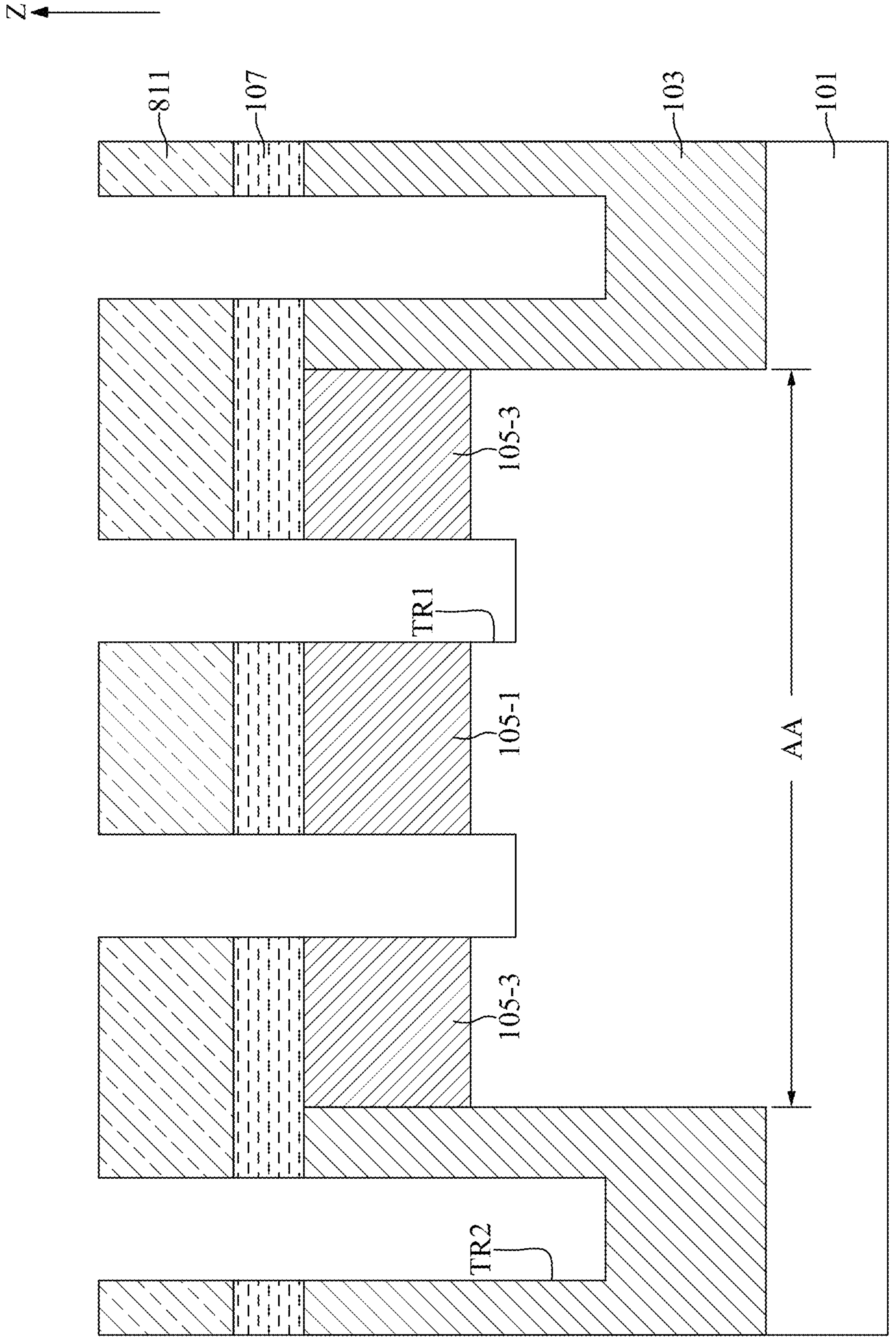

With reference to FIGS. 1 to 3, at step S11, a substrate 101 may be provided, an isolation layer 103 may be formed in the substrate 101 to define an active area AA, a plurality of first trenches TR1 may be formed in the active area AA and a plurality of second trenches TR2 may be formed in the isolation layer 103.

With reference to FIG. 2, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

With reference to FIG. 2, an isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials. In some embodiments, the isolation layer 103 may define an active area AA in the substrate 101.

With reference to FIG. 2, an impurity region 105 may be formed in the active area AA. In some embodiments, the impurity region 105 may be formed by an implantation process using p-type dopants or n-type dopants. The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium, or indium. The term "n-type dopant" refers to an impurity that when added to an intrinsic semiconductor material contributes free electrons to the intrinsic semiconductor material. In a silicon-containing material, examples of n-type dopants include, but are not limited to, antimony, arsenic, or phosphorus.

With reference to FIG. 2, the bottom dielectric layer 107 may be formed on the substrate 101 to completely cover the impurity region 105 and the isolation layer 103. In some embodiments, the bottom dielectric layer 107 may be formed of a material having etching selectivity to the substrate 101 and the isolation layer 103. In some embodiments, the bottom dielectric layer 107 may be formed of, for example, silicon nitride, boron nitride, silicon boron nitride, phosphorus boron nitride, boron carbon silicon nitride, or a combination thereof. In some embodiments, the bottom dielectric layer 107 may be formed of, for example, silicon nitride. In some embodiments, the bottom dielectric layer 107 may be formed by, for example, chemical vapor deposition, plasma-enhanced chemical vapor deposition, or other applicable deposition processes.

With reference to FIG. 2, a first mask layer 811 may be formed on the bottom dielectric layer 107. In some embodiments, the first mask layer 811 may be a photoresist layer and may include the pattern of the plurality of first trenches TR1 and the plurality of second trenches TR2.

With reference to FIG. 3, a trench etching process may be performed using the first mask layer 811 as a mask to remove portions of the bottom dielectric layer 107, the isolation layer 103, and the substrate 101, and concurrently form the plurality of first trenches TR1 in the substrate 101 and the plurality of second trenches TR2 in the isolation layer 103. In some embodiments, the plurality of first trenches TR1 may be shallower than the plurality of second trenches TR2.

After formation of the trenches TR1, TR2, the first mask layer 811 may be removed. The impurity region 105 may be divided into a source region 105-1 and two drain regions 105-3. The drain regions 105-3 may be formed between the isolation layer 103 and the plurality of first trenches TR1. The source region 105-1 may be formed between the plurality of first trenches TR1. The bottom dielectric layer 107 may be divided into multiple segments in a cross-sectional perspective.

With reference to FIG. 1 and FIGS. 4 to 10, at step S13, a layer of first dielectric material 711 may be conformally formed in the plurality of first trenches TR1 and the plurality of second trenches TR2, a plurality of first bottom conductive layers 203 and a plurality of second bottom conductive layers 303 may be formed on the layer of first dielectric material 711, and a plurality of first top conductive layers 205 and a plurality of second top conductive layers 305 may be formed on the plurality of first bottom conductive layers 203 and the plurality of second bottom conductive layers 303.

Figure 4:
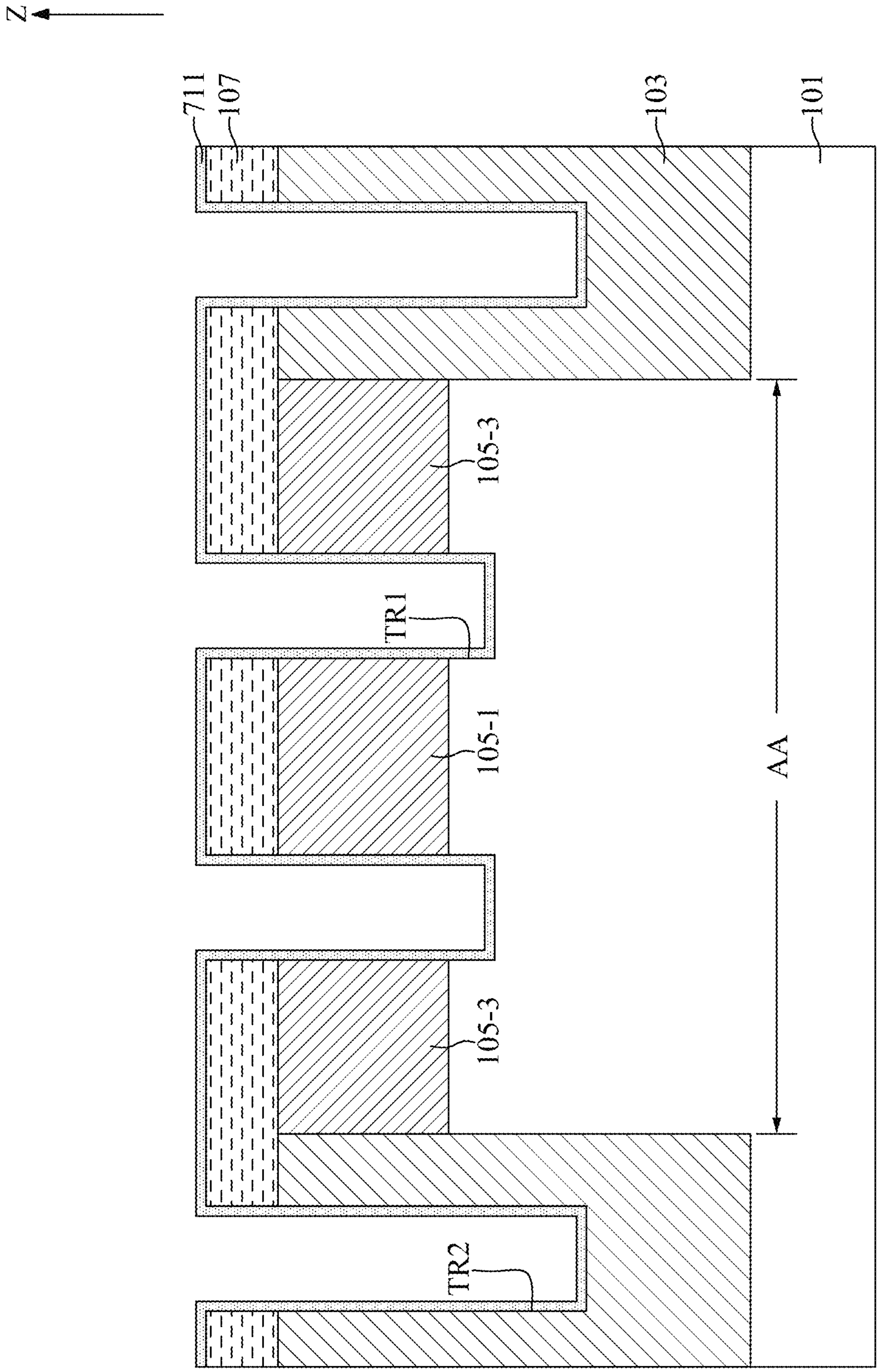

With reference to FIG. 4, the layer of first dielectric material 711 may be conformally formed on the bottom dielectric layer 107 and in the plurality of first trenches TR1 and the plurality of second trenches TR2. The layer of first dielectric material 711 may have a U-shaped cross-sectional profile within the trenches TR1, TR2. That is, the layer of first dielectric material 711 may be conformally formed along the surface of the trenches TR1, TR2. In some embodiments, the layer of first dielectric material 711 may have a thickness in a range of about 1 nm to about 7 nm, including about 1 nm, about 2 nm, about 3 nm, about 4 nm, about 5 nm, about 6 nm, or about 7 nm.

In some embodiments, the layer of first dielectric material 711 may be formed by a deposition process such as a chemical vapor deposition or an atomic layer deposition. In some embodiments, after a liner polysilicon layer (not shown for clarity) is deposited, the layer of first dielectric material 711 may be formed by radical oxidizing the liner polysilicon layer. In some embodiments, after a liner silicon nitride layer (not shown for clarity) is formed, the layer of first dielectric material 711 may be formed by radical oxidizing the liner silicon nitride layer. In some embodiments, the first dielectric material 711 may include a material having etching selectivity to the bottom dielectric layer 107 and the substrate 101. In some embodiments, the first dielectric material 711 may include a high-k material, an oxide (e.g., silicon oxide), a nitride, an oxynitride or combinations thereof.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

Figure 5:
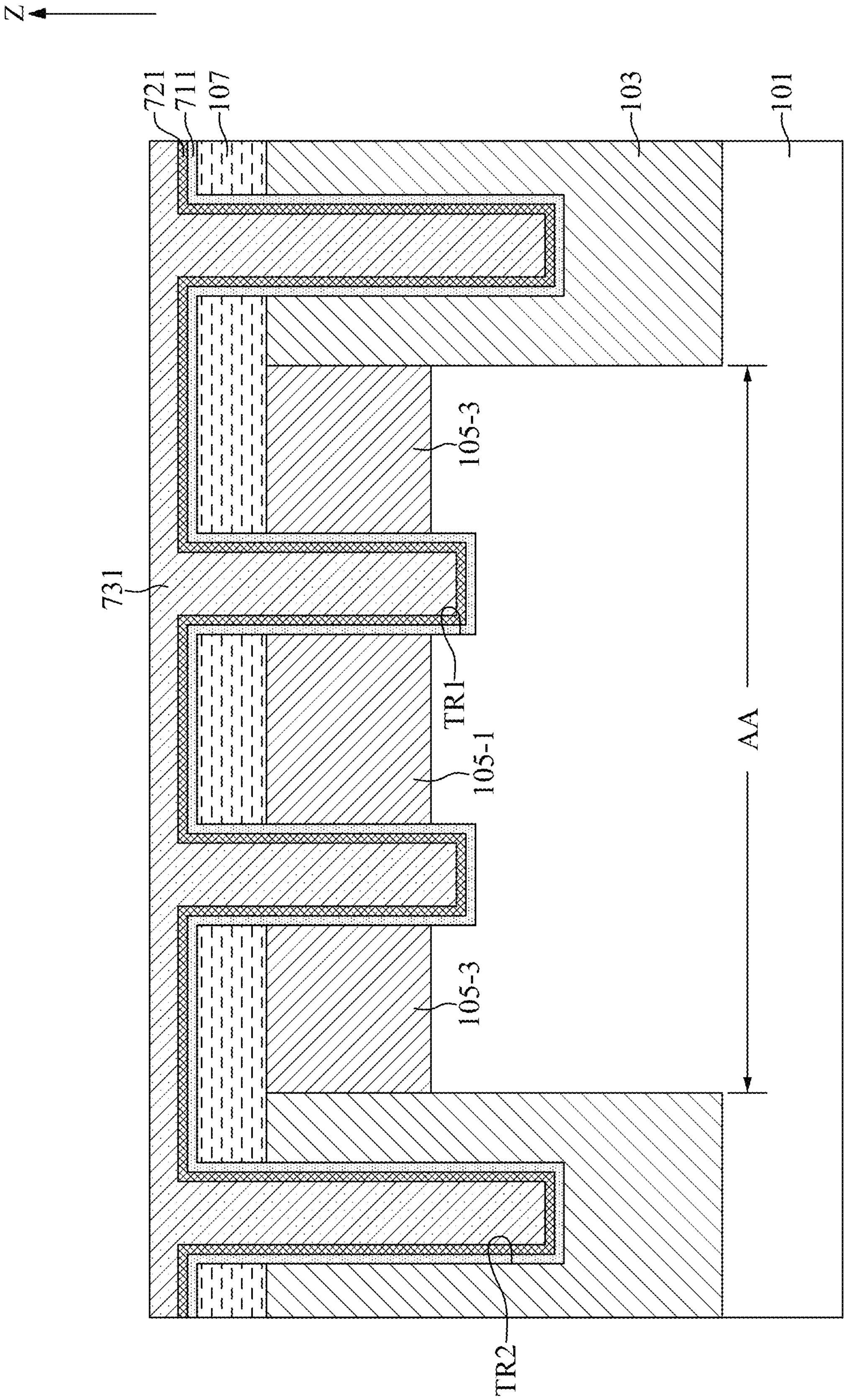

With reference to FIG. 5, a layer of first barrier material 721 may be conformally formed on the layer of first dielectric material 711. In some embodiments, the first barrier material 721 may be, for example, titanium nitride, titanium, or a combination thereof. In some embodiments, the first barrier material 721 may be, for example, titanium nitride. In some embodiments, the layer of first barrier material 721 may be formed by, for example, atomic layer deposition, physical vapor deposition, chemical vapor deposition, or other applicable deposition processes.

With reference to FIG. 5, a layer of first conductive material 731 may be formed on the layer of first barrier material 721 and completely fill the trenches TR1, TR2. In some embodiments, the first conductive material 731 may be, for example, tungsten, cobalt, zirconium, tantalum, aluminum, ruthenium, copper, metal carbides (e.g., tantalum carbide, titanium carbide, tantalum magnesium carbide), transition metal aluminides, titanium nitride, or a combination thereof.

In some embodiments, the first conductive material 731 may be, for example, tungsten or titanium nitride. In some embodiments, the layer of first conductive material 731 may be formed by, for example, physical vapor deposition, sputtering, electroplating, electroless plating, chemical vapor deposition, or other applicable deposition processes. In some embodiments, the layer of first barrier material 721 may be optional. That is, the layer of first conductive material 731 may be formed on the layer of first dielectric material 711 and completely fill the trenches TR1, TR2.

Figure 6:
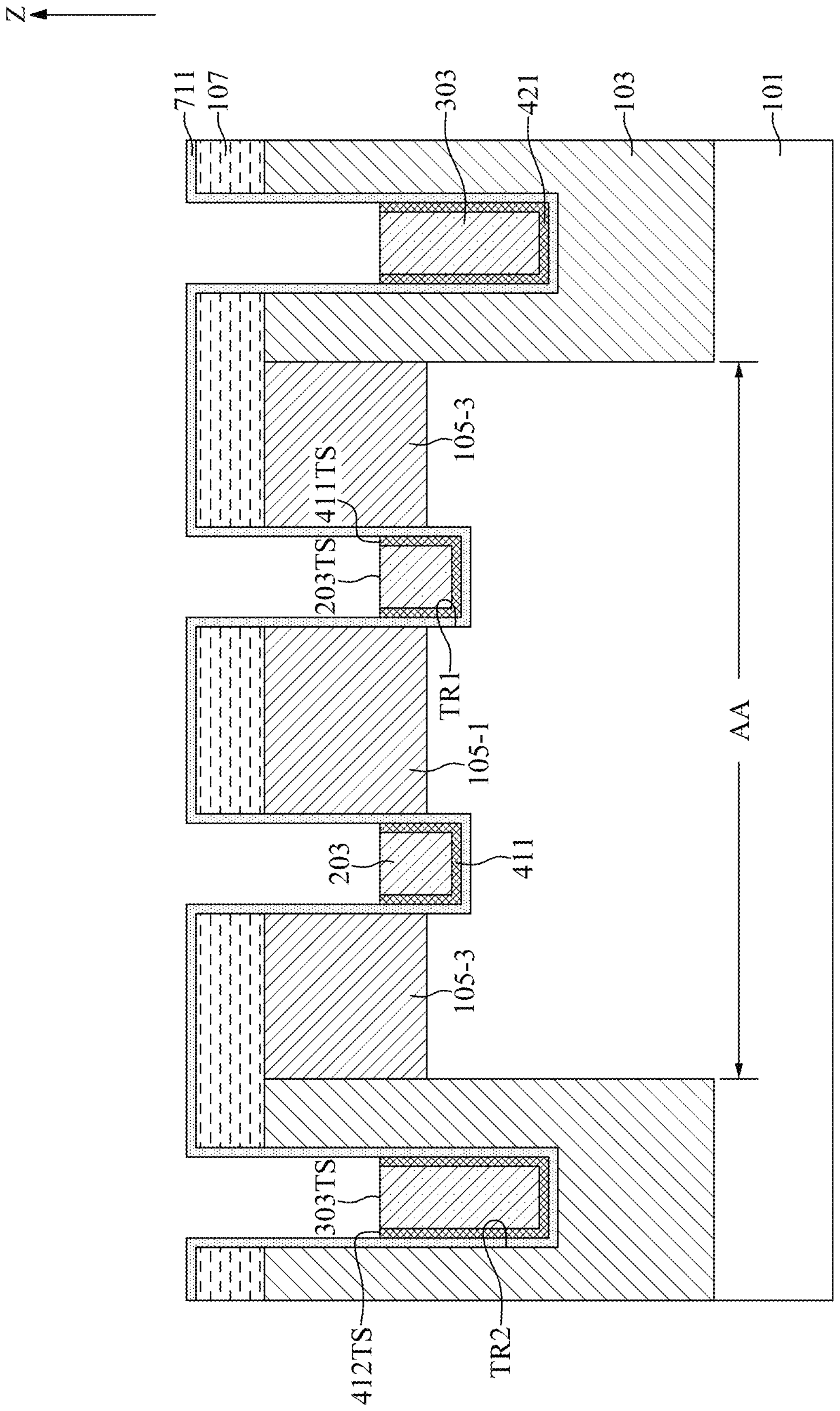

With reference to FIG. 6, an etching back process may be performed to remove portions of the first barrier material 721 and the first conductive material 731. After the etching back process, the remaining first barrier material 721 is tuned into a plurality of first bottom barrier layers 411 and a plurality of second bottom barrier layers 421. The plurality of first bottom barrier layers 411 may be formed on the layer of first dielectric material 711 and within the plurality of first trenches TR1. The plurality of second bottom barrier layers 421 may be formed on the layer of first dielectric material 711 and within the plurality of second trenches TR2.

The remaining first conductive material 731 is turned into the plurality of first bottom conductive layers 203 and the plurality of second bottom conductive layers 303. The plurality of first bottom conductive layers 203 may be formed on the plurality of first bottom barrier layers 411 and within the plurality of first trenches TR1. The plurality of second bottom conductive layers 303 may be formed on the plurality of second bottom barrier layers 421 and within the plurality of second trenches TR2.

For brevity, clarity, and convenience of description, only one first bottom barrier layer 411, one second bottom barrier layer 421, one first bottom conductive layer 203, and one second bottom conductive layer 303 are described.

With reference to FIG. 6, in some embodiments, the top surface 203TS of the first bottom conductive layer 203, the top surface 303TS of the second bottom conductive layer 303, the top surface 411TS of the first bottom barrier layer 411, and the top surface 421TS of the second bottom barrier layer 421 may be substantially coplanar. In some embodiments, the top surface 203TS of the first bottom conductive layer 203, the top surface 303TS of the second bottom conductive layer 303, the top surface 411TS of the first bottom barrier layer 411, and the top surface 421TS of the second bottom barrier layer 421 may be at different vertical levels (not shown).

In some embodiments, the layer of first dielectric material 711 attached on the bottom dielectric layer 107 may be reduced in thickness due to consumption during etching back and/or post-etching cleaning processes. Consequently, those portions of the layer of first dielectric material 711 end up thinner compared to the other portions of the layer of first dielectric material 711.

Figure 7:
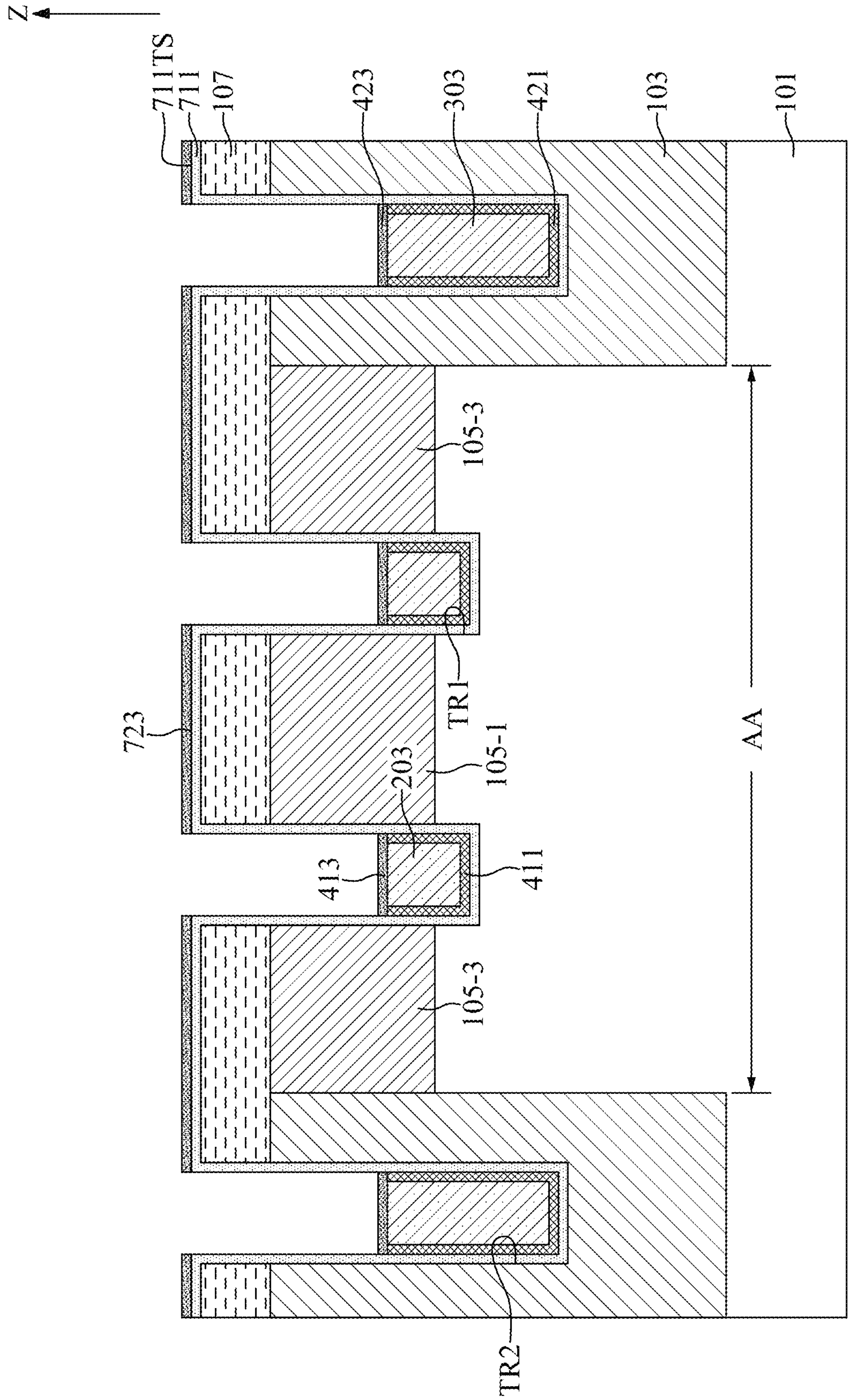

With reference to FIG. 7, a layer of second barrier material 723 may be formed on the top surface 711TS of the layer of first dielectric material 711 and formed within the trenches TR1, TR2. The second barrier material 723 formed within the first trenches TR1 may be referred to as a plurality of first middle barrier layers 413 and may be formed on the plurality of first bottom conductive layers 203. The second barrier material 723 formed within the second trenches TR2 may be referred to as a plurality of second middle barrier layers 423 and may be formed on the plurality of second bottom conductive layers 303. For brevity, clarity, and convenience of description, only one first middle barrier layer 413 and one second middle barrier layer 423 are described.

In some embodiments, the first middle barrier layer 413 may also cover the first bottom barrier layer 411. The second middle barrier layer 423 may also cover the second bottom barrier layer 421. That is, the first bottom conductive layer 203 may be surrounded by the first bottom barrier layer 411 and the first middle barrier layer 413 in a cross-sectional perspective. The second bottom conductive layer 303 may be surrounded by the second bottom barrier layer 421 and the second middle barrier layer 423 in a cross-sectional perspective.

In some embodiments, the second barrier material 723 (i.e., the first middle barrier layer 413 and the second middle barrier layer 423) may be, for example, titanium nitride, titanium, or a combination thereof. In some embodiments, the second barrier material 723 may be, for example, titanium nitride. In some embodiments, the second barrier material 723 may be the same material as the first bottom barrier layer 411. In some embodiments, the layer of second barrier material 723 may be formed by, for example, radio-frequency physical vapor deposition or other applicable deposition. In some embodiments, the layer of second barrier material 723 may be optional. That is, the subsequent layer may be directly formed on the first bottom conductive layer 203 or the second bottom conductive layer 303.

Figure 8:
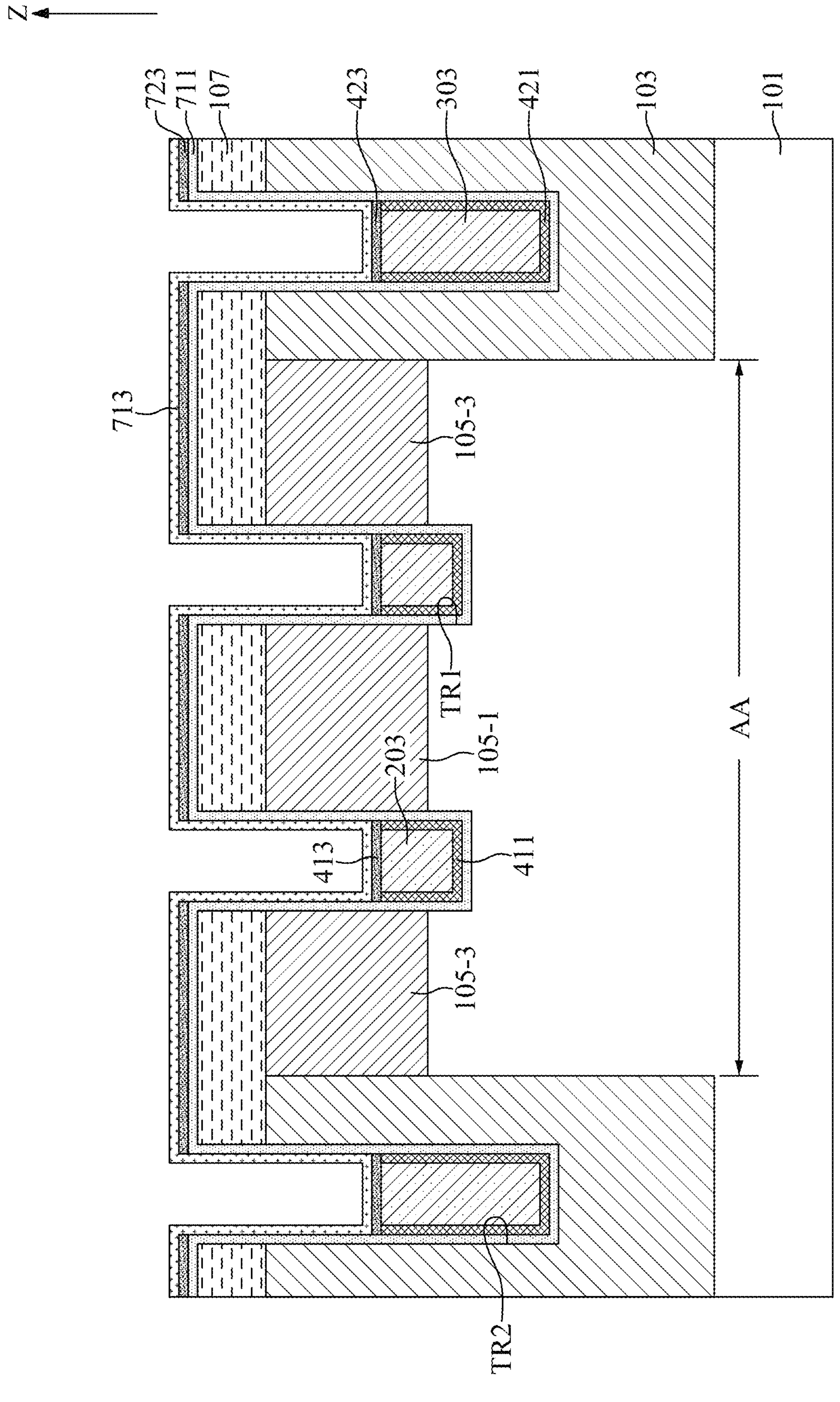

With reference to FIG. 8, the layer of first insulating material 713 may be conformally formed on the layer of first dielectric material 711, the bottom dielectric layer 107, the layer of second barrier material 723, the plurality of first middle barrier layers 413, and the plurality of second middle barrier layers 423. In some embodiments, due to conforming to the layer of first dielectric material 711, the first middle barrier layer 413, and the second middle barrier layer 423, the layer of first insulating material 713 formed within the trenches TR1, TR2 may exhibit a U-shaped cross-sectional profile. In some embodiments, the first insulating material 713 may be, for example, a material having etching selectivity to the bottom dielectric layer 107. In some embodiments, the first dielectric material 711 and the first insulating material 713 may include the same material. In some embodiments, the first insulating material 713 may be, for example, silicon oxide. In some embodiments, the layer of first insulating material 713 may be formed by, for example, atomic layer deposition, chemical vapor deposition, or other applicable deposition processes. In some embodiments, the layer of first insulating material 713 may be optional. That is, the subsequent layer may be directly formed on the first bottom conductive layer 203 or the second bottom conductive layer 303.

Figure 9:
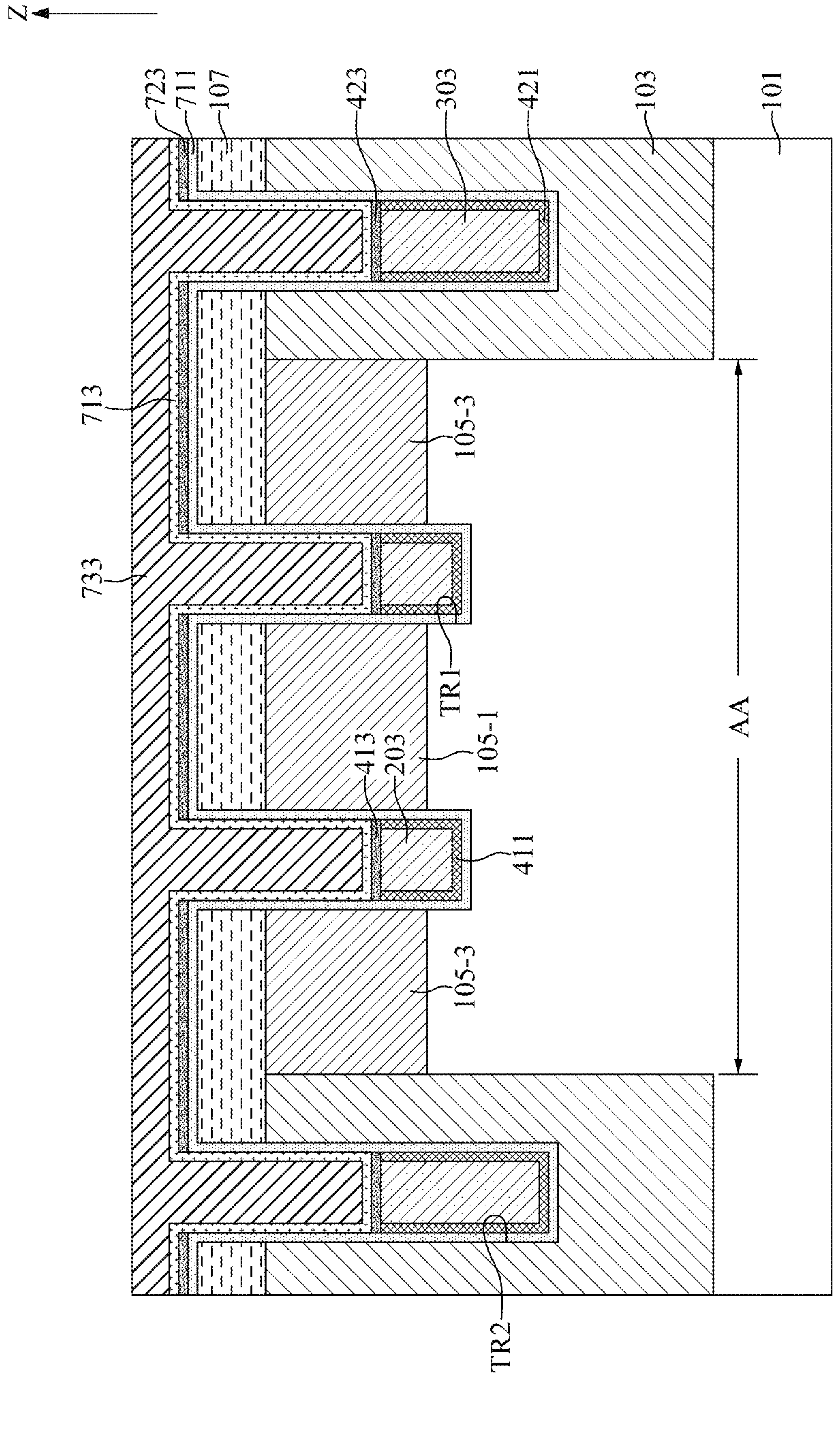

With reference to FIG. 9, a layer of second conductive material 733 may be formed on the layer of first insulating material 713 and completely fill the trench TR1, TR2. In some embodiments, the second conductive material 733 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the layer of second conductive material 733 may be doped with p-type dopants or n-type dopants. In some embodiments, the layer of second conductive material 733 may be formed by, for example, chemical vapor deposition or other applicable deposition processes. In some embodiments, the doping may be achieved by an implantation process after the deposition process. In some embodiments, the doping may be performed by incorporating the dopants during the deposition process.

Figure 10:
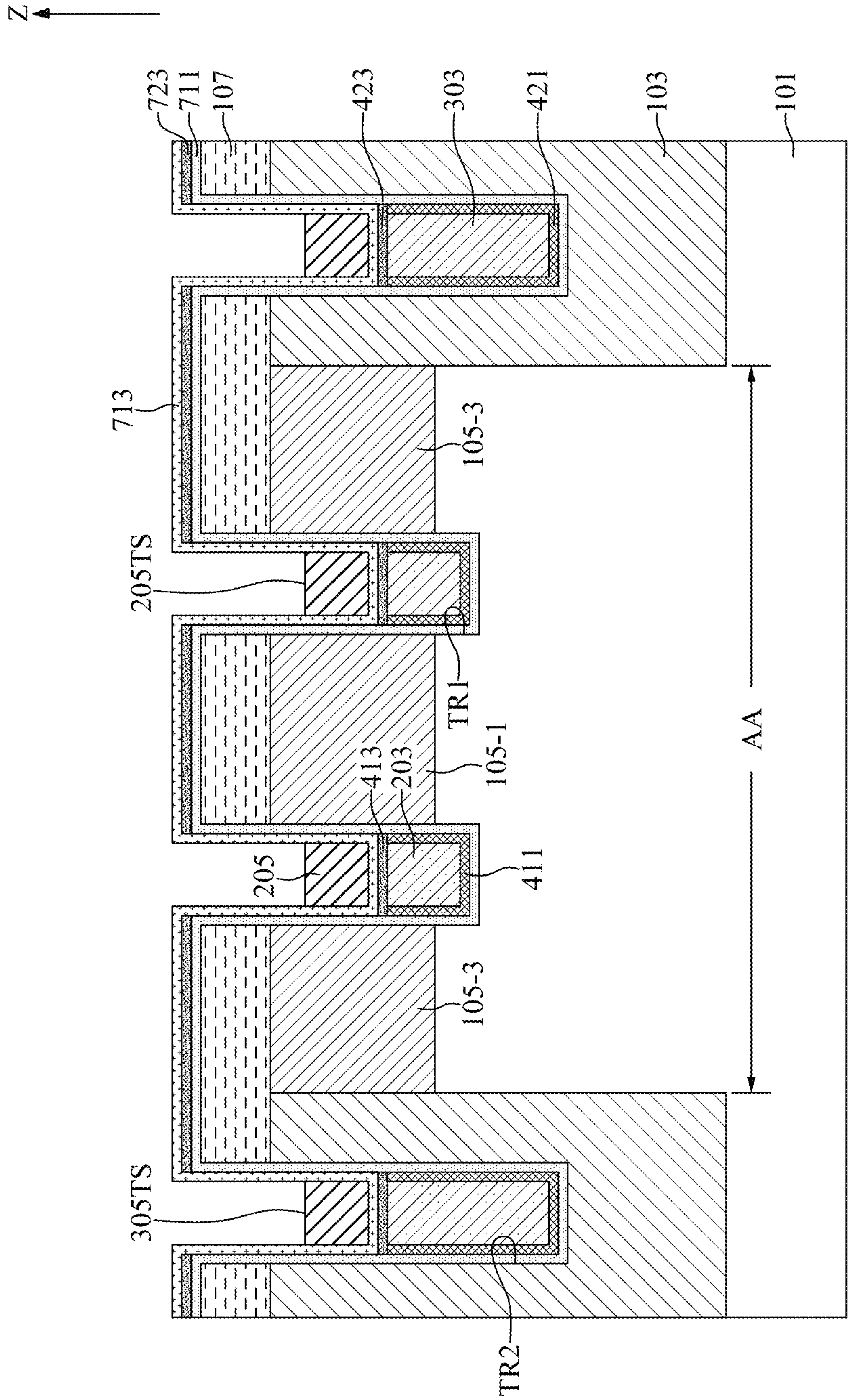

With reference to FIG. 10, an etching back process may be subsequently performed to remove portions of the second conductive material 733 to form the plurality of first top conductive layers 205 and the plurality of second top conductive layers 305. For brevity, clarity, and convenience of description, only one first top conductive layer 205 and one second top conductive layer 305 are described. The first top conductive layer 205 may be formed on the layer of first insulating material 713 and within the first trench TR1. The second top conductive layer 305 may be formed on the layer of first insulating material 713 and within the second trench TR2. In some embodiments, the top surface 205TS of the first top conductive layer 205 and the top surface 305TS of the second top conductive layer 305 may be substantially coplanar.

Figure 11:
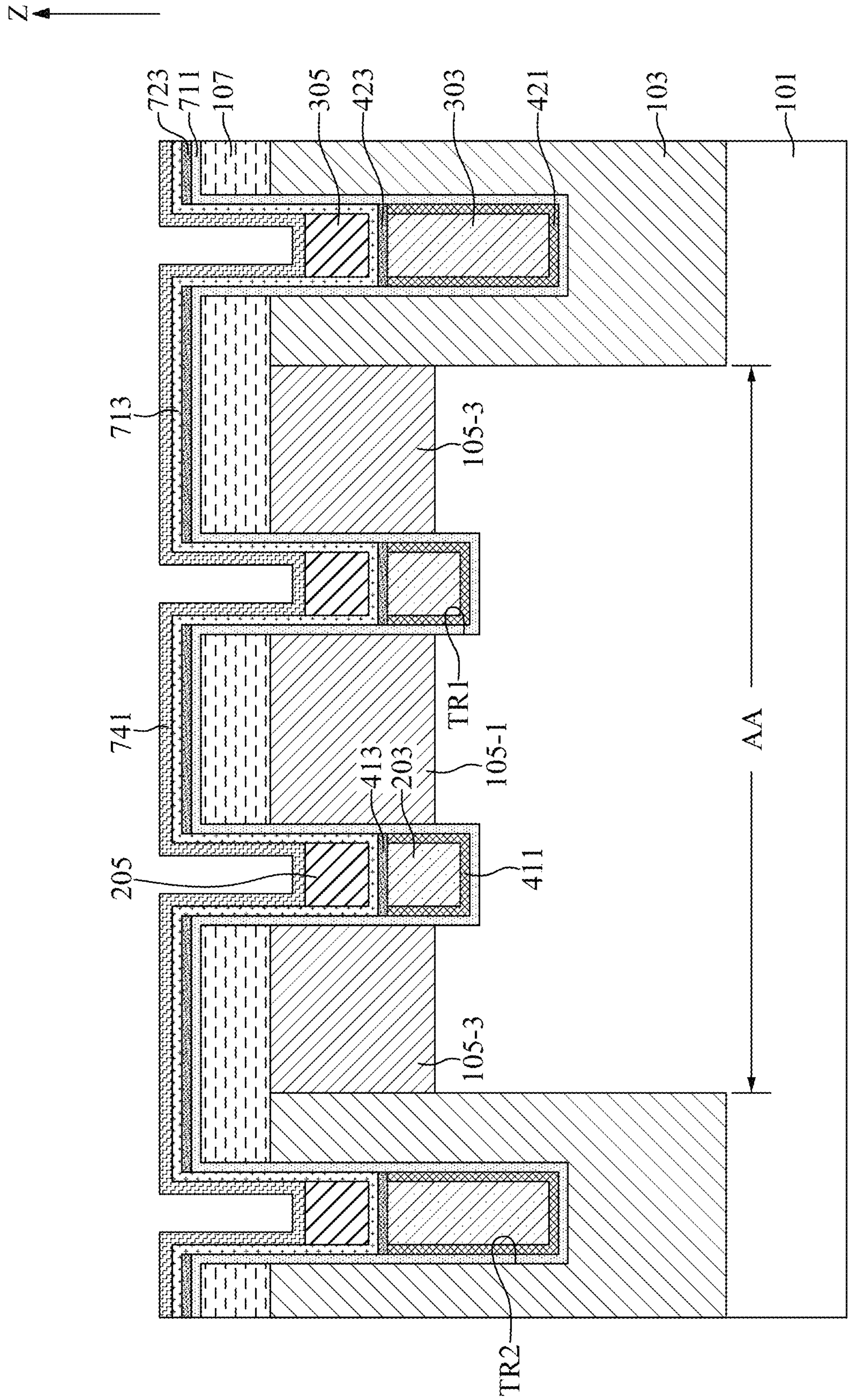
Figure 12:
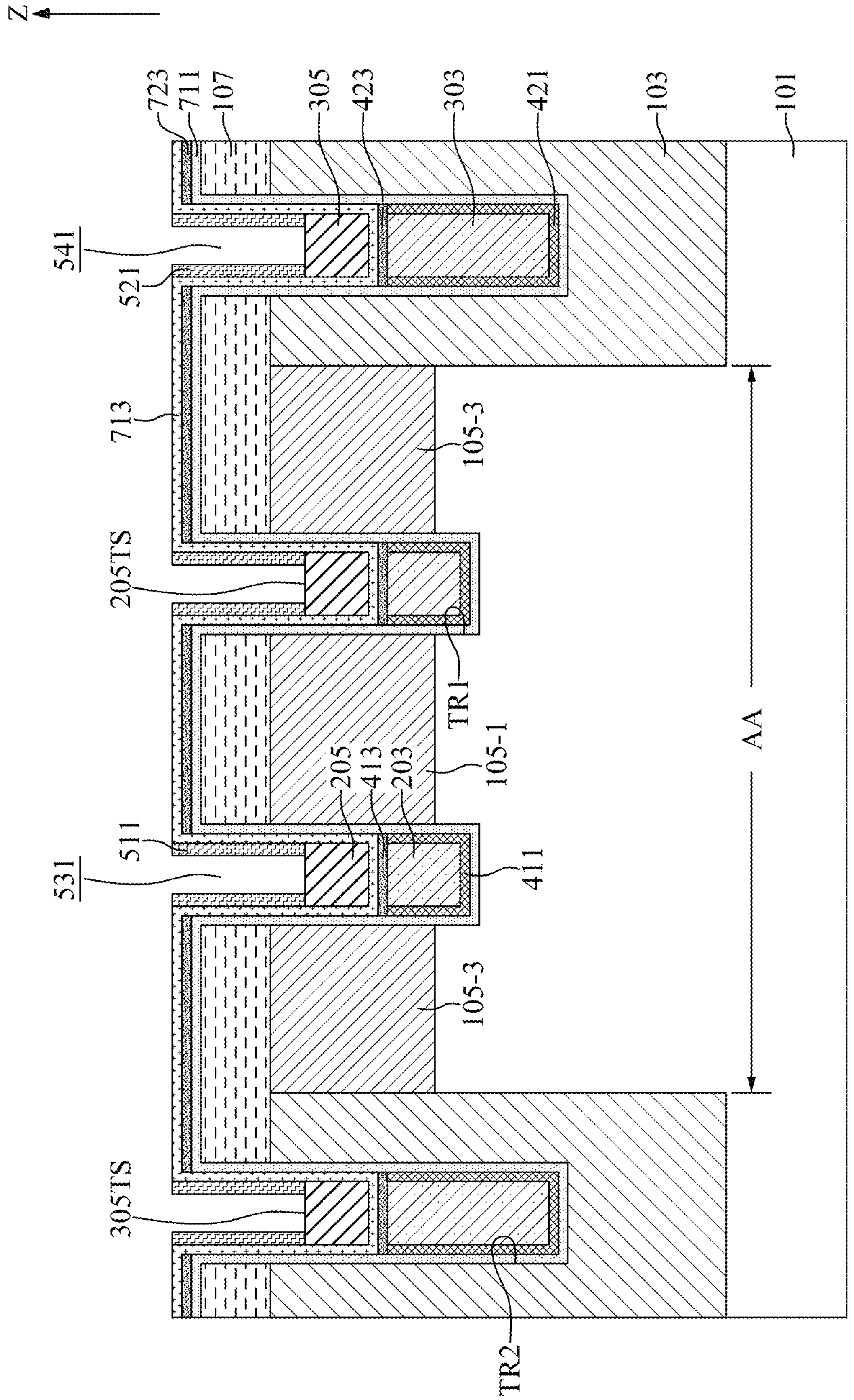

With reference to FIGS. 1, 11, and 12, at step S15, a plurality of first spacers 511 may be formed on the plurality of first top conductive layers 205, resulting in a plurality of first inner trenches 531, and a plurality of second spacers 521 may be formed on the plurality of second top conductive layers 305, resulting in a plurality of second inner trenches 541.

With reference to FIG. 11, a layer of spacer material 741 may be conformally formed on the layer of first insulating material 713, the plurality of first top conductive layers 205, and the plurality of second top conductive layers 305. The trenches TR1, TR2 are not completely filled by the layer of spacer material 741. In some embodiments, the spacer material 741 may be formed of a material having etching selectivity to the first top conductive layer 205 and the second top conductive layer 305. In some embodiments, the spacer material 741 may be formed of a material having etching selectivity to the first top conductive layer 205, the first insulating material 713, and/or the first dielectric material 711. In some embodiments, the spacer material 741 may be formed of, for example, silicon nitride. In some embodiments, the layer of spacer material 741 may be formed by, for example, atomic layer deposition, chemical vapor deposition, or other applicable deposition processes.

With reference to FIG. 12, a punch-through process may be performed to remove a portion of the spacer material 741. In some embodiments, the punch-through process may be an anisotropic etching process such as an anisotropic dry etching process. After the punch-through process, the remaining spacer material 741 in the first trench TR1 may be referred to as the plurality of first spacers 511. The first inner trench 531 may be formed between an adjacent pair of the plurality of first spacers 511. The top surface 205TS of the first top conductive layer 205 may be partially exposed through the first inner trench 531. The remaining spacer material 741 in the second trench TR2 may be referred to as the plurality of second spacers 521. The second inner trench 541 may be formed between an adjacent pair of the plurality of second spacers 521. The top surface 305TS of the second top conductive layer 305 may be partially exposed through the second inner trench 541.

Figure 13:
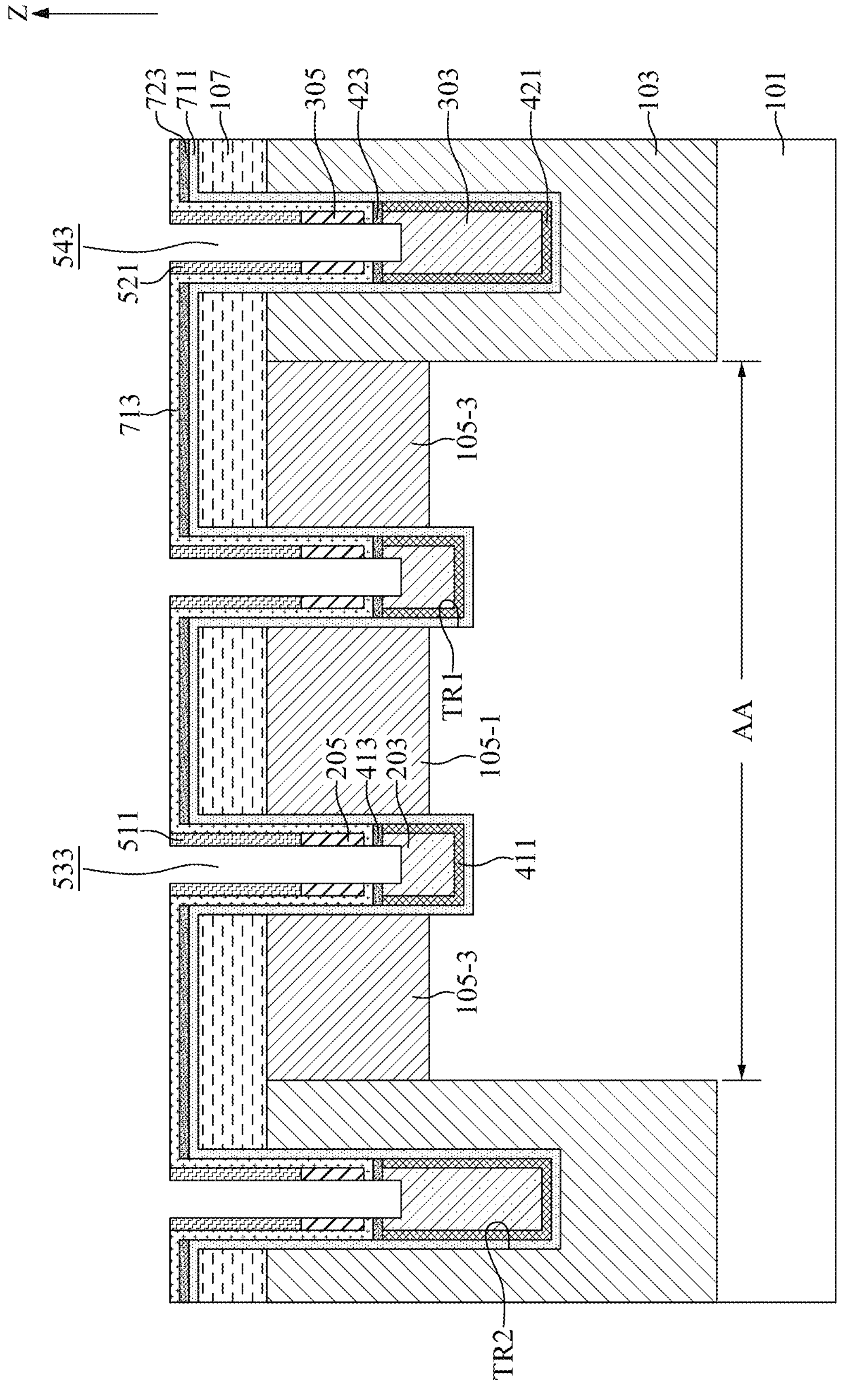

With reference to FIGS. 1 and 13, at step S17, the plurality of first inner trenches 531 and the plurality of second inner trenches 541 may be deepened to form a plurality of first extended inner trenches 533 and a plurality of second extended inner trenches 543, which partially expose the plurality of first bottom conductive layers 203 and the plurality of second bottom conductive layers 303.

With reference to FIG. 13, the deepening of both the first inner trench 531 and the second inner trench 541 may be achieved through an anisotropic etching process, using the plurality of first spacers 511 and second spacers 521 as masks. For example, this deepening might be facilitated by an anisotropic dry etching process. In some embodiments, the anisotropic etching process may be a multi-stage etching process, with different stages employing varying etching chemistries to selectively remove targeted layer(s).

For brevity, clarity, and convenience of description, only one first extended inner trench 533 and one second extended inner trench 543 are described.

With reference to FIG. 13, the first inner trench 531 is deepened to form the first extended inner trench 533, which penetrates through the first top conductive layer 205, the layer of first insulating material 713, the first middle barrier layer 413, and extends down to the first bottom conductive layer 203. Similarly, the second extended inner trench 543 cuts through the second top conductive layer 305, the layer of first insulating material 713, the second middle barrier layer 423, and reaches the second bottom conductive layer 303.

Consequently, both the first top conductive layer 205 and the first middle barrier layer 413 are bifurcated into two segments by the first extended inner trench 533. Likewise, the second top conductive layer 305 and the second middle barrier layer 423 are each split into two segments by the second extended inner trench 543. The layer of first insulating material 713 becomes segmented by both the first and second extended inner trenches 533, 543, while the first bottom conductive layer 203 and the second bottom conductive layer 303 are partially revealed through these trenches 533, 543.

With reference to FIG. 1 and FIGS. 14 to 16, at step S19, the plurality of first trenches TR1 and the plurality of second trenches TR2 may be completely filled to form a plurality of first capping layers 207 and a plurality of second capping layers 307.

Figure 14:
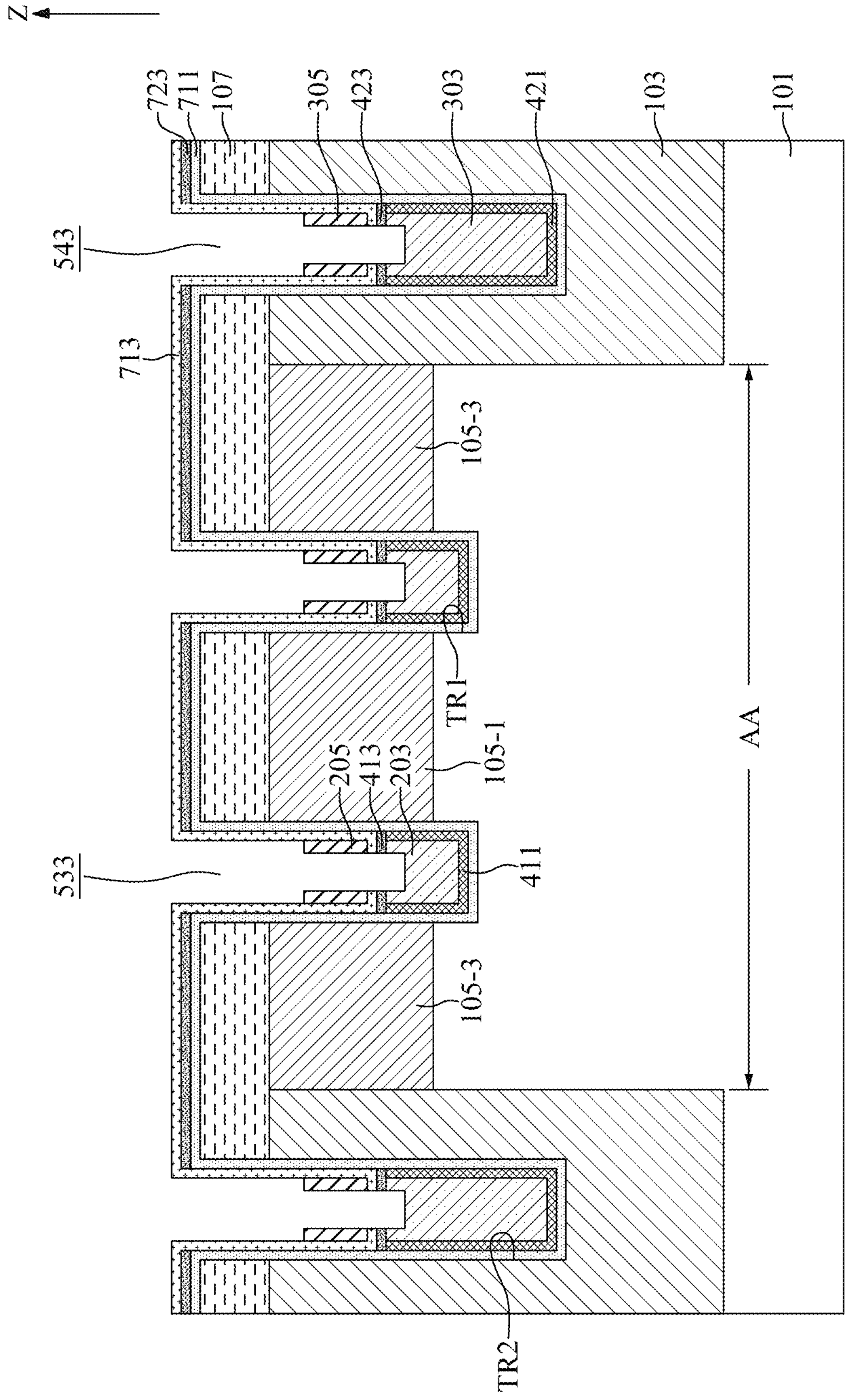

With reference to FIG. 14, the plurality of first spacers 511 and second spacers 521 may be selectively removed. Following the removal of spacers 511, 521, both the first extended inner trench 533 and the second extended inner trench 543 may exhibit a T-shaped space when viewed in cross-section. Detailedly, the upper portion of the first extended inner trench 533 or the second extended inner trench 543 is wider than its respective lower portion.

Figure 15:
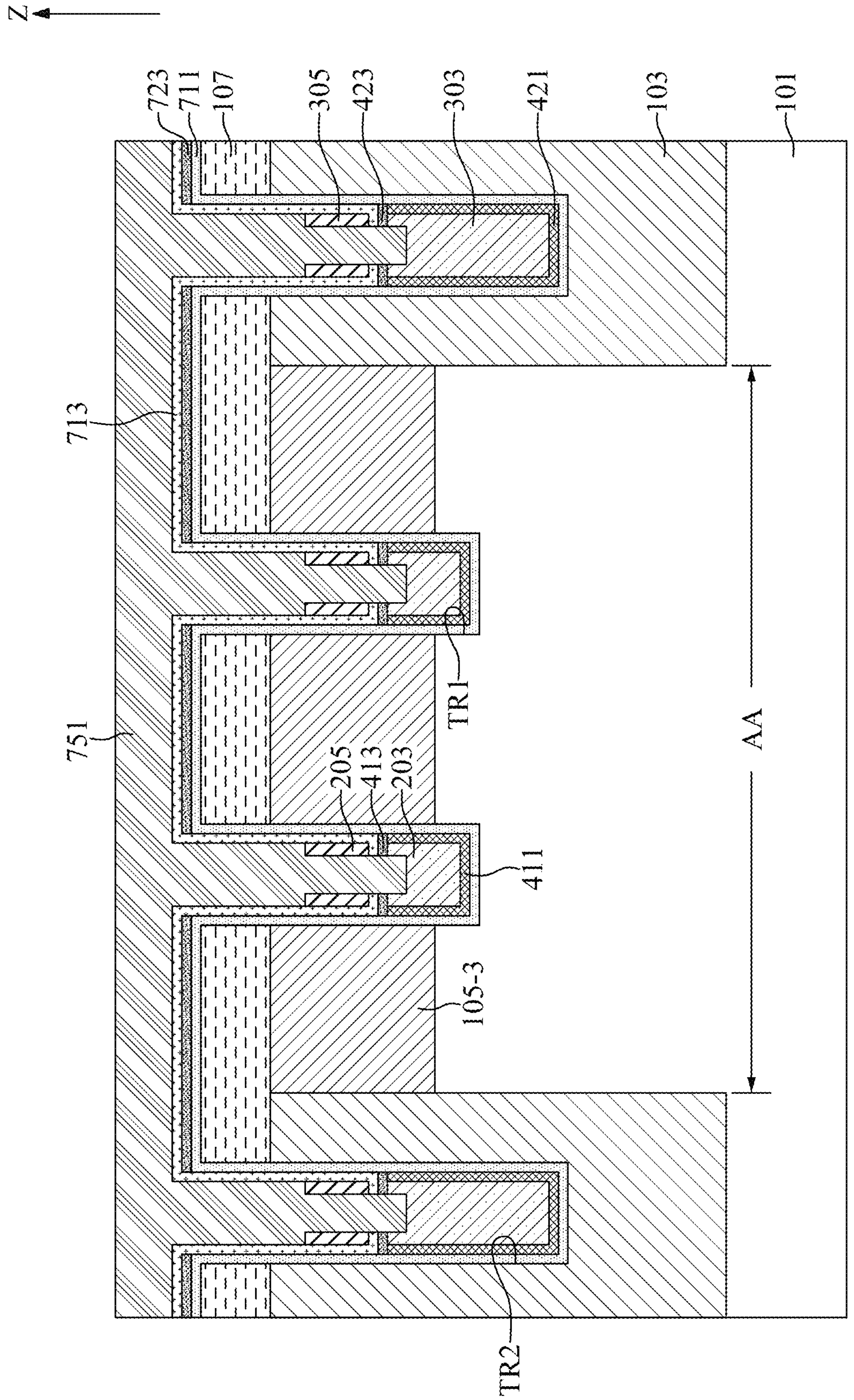

With reference to FIG. 15, a layer of capping material 751 may be formed to completely fill the first extended inner trench 533 and the second extended inner trench 543, thereby also filling the trenches TR1, TR2. In some embodiments, the capping material 751 may be, for example, a material having etching selectivity to the first insulating material 713 and the first dielectric material 711. In some embodiments, the capping material 751 may be, for example, silicon nitride, boron nitride, silicon boron nitride, phosphorus boron nitride, boron carbon silicon nitride, or a combination thereof. In some embodiments, the capping material 751 may be, for example, silicon nitride. In some embodiments, the layer of capping material 751 may be formed by, for example, chemical vapor deposition, plasma-enhanced chemical vapor deposition, or other applicable deposition processes.

Figure 16:
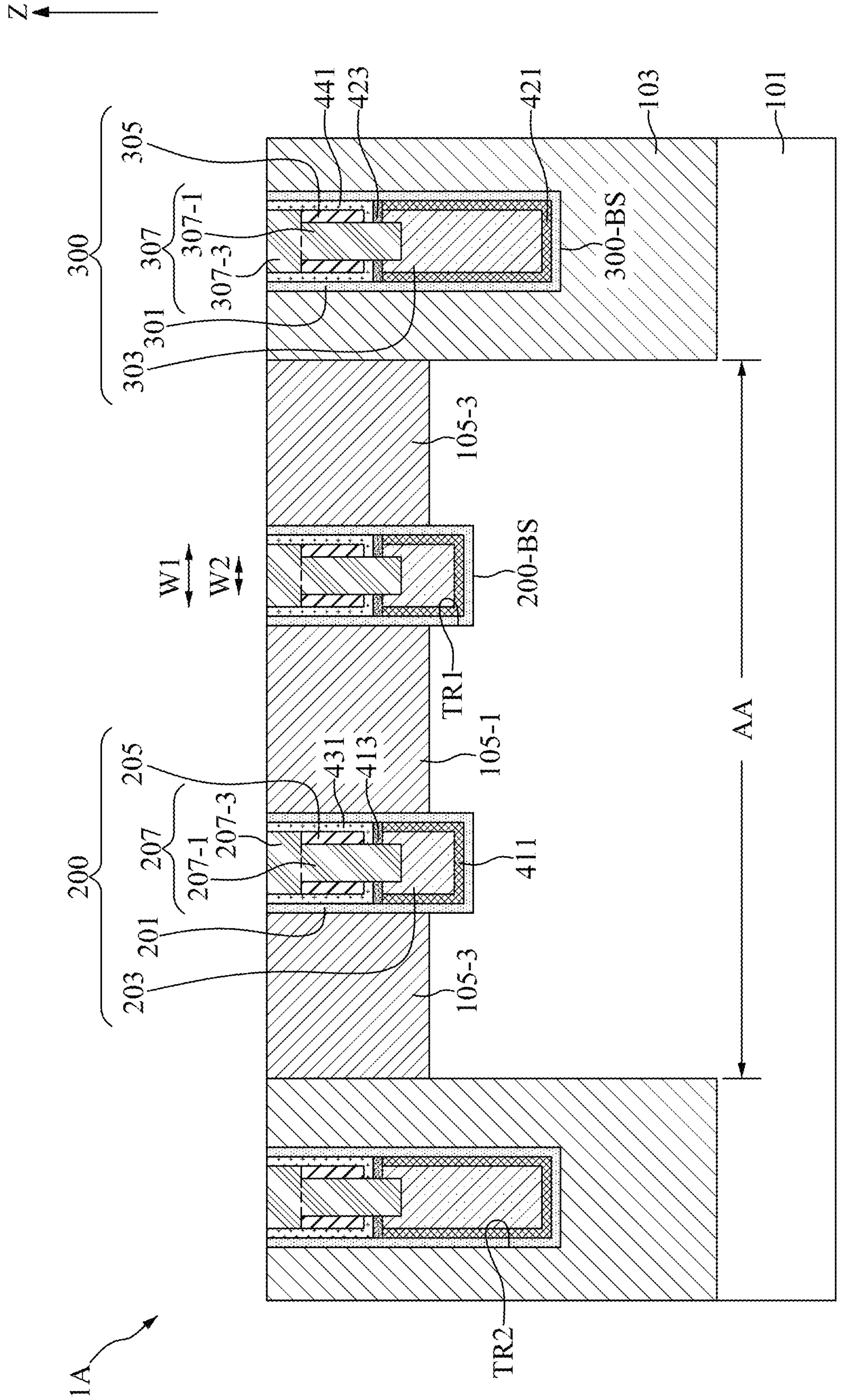

With reference to FIG. 16, a planarization process, such as chemical mechanical polishing, may be performed until the isolation layer 103 (or the substrate 101) is exposed to remove excess material and provide a substantially flat surface for subsequent processing steps. After the planarization process, the remaining first dielectric material 711 within the first trench TR1 may be referred to as a first word line dielectric layer 201. The remaining first dielectric material 711 within the second trench TR2 may be referred to as a second word line dielectric layer 301. The remaining first insulating material 713 within the first trench TR1 may be referred to as the first thickening layer 431. The remaining first insulating material 713 within the second trench TR2 may be referred to as the second thickening layer 441. The remaining capping material 751 within the first trench TR1 may be referred to as the first capping layer 207. The remaining capping material 751 within the second trench TR2 may be referred to as the second capping layer 307.

The first word line dielectric layer 201, the first bottom conductive layer 203, the first top conductive layer 205, and the first capping layer 207 together configure a first word line structure 200. The second word line dielectric layer 301, the second bottom conductive layer 303, the second top conductive layer 305, and the second capping layer 307 together configure the second word line structure 300. In some embodiments, the bottom surface 200BS of the first word line structure 200 may be shallower than the bottom surface 300BS of the second word line structure 300.

With reference to FIG. 16, the first capping layer 207 may have a T-shaped cross-sectional profile, conforming to the contours of the first extended inner trench 533. The first capping layer 207 may include a bottom portion 207-1 and a top portion 207-3. The bottom portion 207-1 may penetrate through the first top conductive layer 205 and the first middle barrier layer 413 and extend down to the first bottom conductive layer 203. Positioned above the bottom portion 207-1, the top portion 207-3 may rest on both the bottom portion 207-1 and the first top conductive layer 205 and may be laterally surrounded by the first thickening layer 431. In some embodiments, the width W1 of the top portion 207-3 may be greater than the width W2 of the bottom portion 207-1. Likewise, the second capping layer 307 may feature a similar structure, with a bottom portion 307-1 and a top portion 307-3 analogous to those of the first capping layer 207, and further details of these components are not reiterated here for brevity. In some embodiments, the width ratio of the width W1 of the top portion 207-3 to the width W2 of the bottom portion 207-1 may be between about 4.0 and about 1.5.

In some embodiments, the first bottom conductive layer 203 and the first top conductive layer 205 may be composed of materials with differing work functions, effectively reducing gate-induced drain leakage in the first word line structure 200. Additionally, replacing sections of the first top conductive layer 205 with the bottom portion 207-1 of the first capping layer 207 may help mitigate issues such as line end wiggling. Moreover, incorporating the first thickening layer 431 may enhance the insulating capability of the first word line dielectric layer 201 by increasing its thickness. This is particularly beneficial, as the word line dielectric layer 201 may be prone to being consumed during processes like etching back or cleaning, which could otherwise lead to gate-induced drain leakage.

Figure 17:
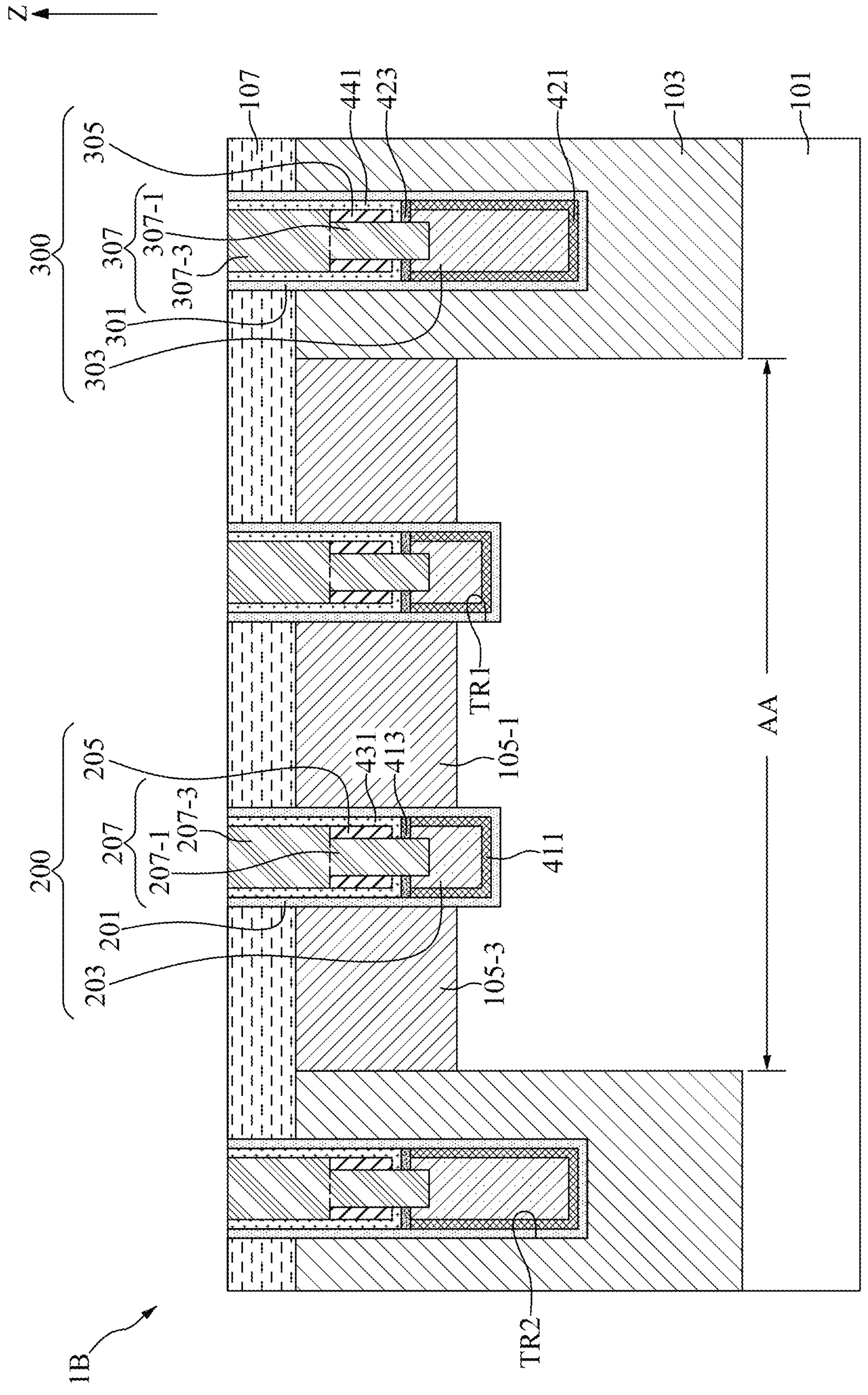
FIG. 17 illustrates, in a schematic cross-sectional view diagram, a semiconductor device in accordance with another embodiment of the present disclosure.

FIG. 17 illustrates, in a schematic cross-sectional view diagram, a semiconductor device 1B in accordance with another embodiment of the present disclosure.

With reference to FIG. 17, the semiconductor device 1B may have a structure similar to that illustrated in FIG. 16. The same or similar elements in FIG. 17 as in FIG. 16 have been marked with similar reference numbers and duplicative descriptions have been omitted.

For semiconductor device 1B, the planarization process as illustrated in FIG. 16 may be performed until the bottom dielectric layer 107 is exposed so that the bottom dielectric layer 107 may be intact or only partially removed. Therefore, the first word line dielectric layer 201 (or the second word line dielectric layer 301) may be laterally surrounded by the bottom dielectric layer 107. The top portion 207-3 (or the top portion 307-3) may be thicker along the direction Z compared to those illustrated in FIG. 16. The bottom dielectric layer 107 may serve as a buffer layer, a protection layer, or an etching stop layer for the following processes.

Figure 18:
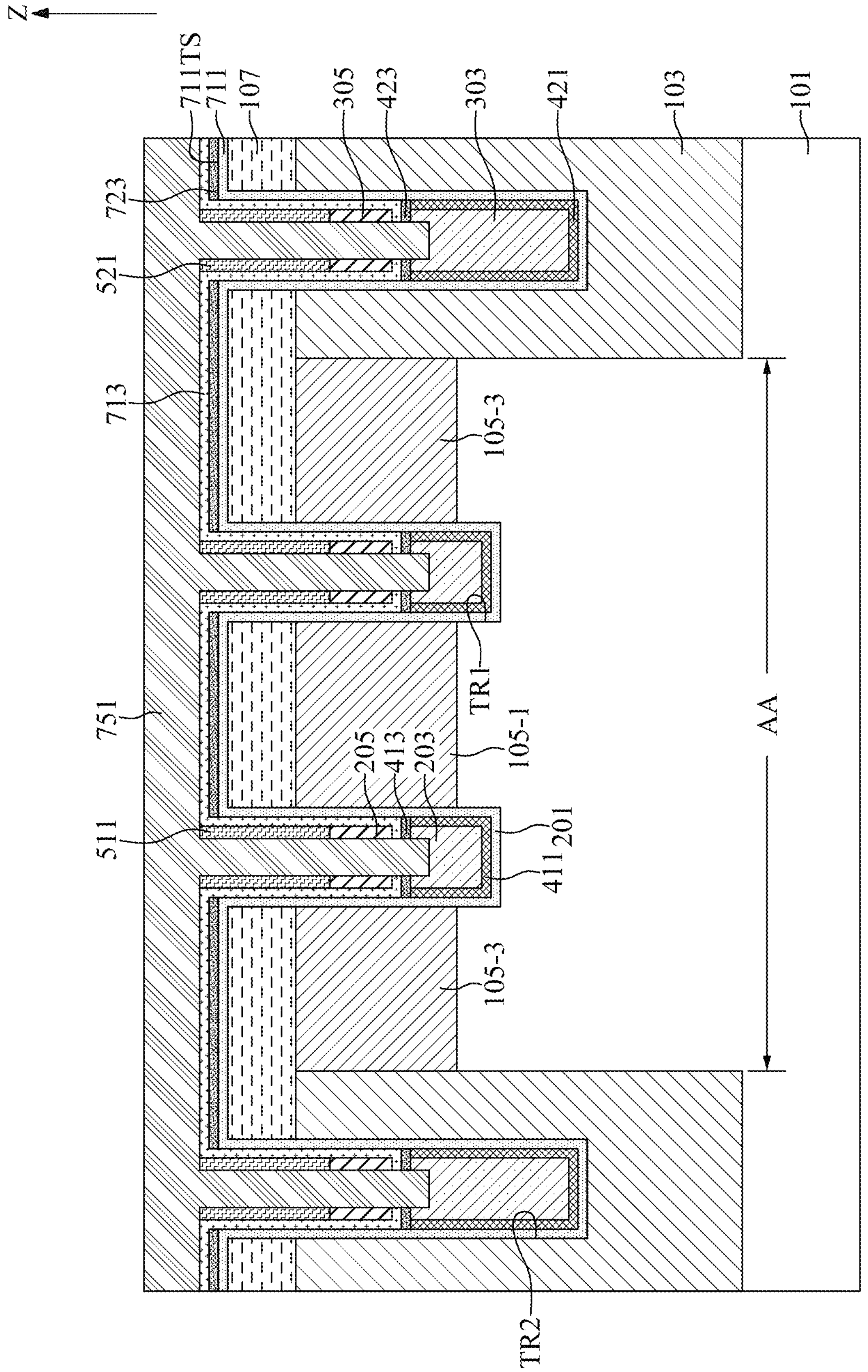
FIGS. 18 and 19 illustrate, in schematic cross-sectional view diagrams, part of a flow for fabricating a semiconductor device in accordance with another embodiment of the present disclosure.
Figure 19:
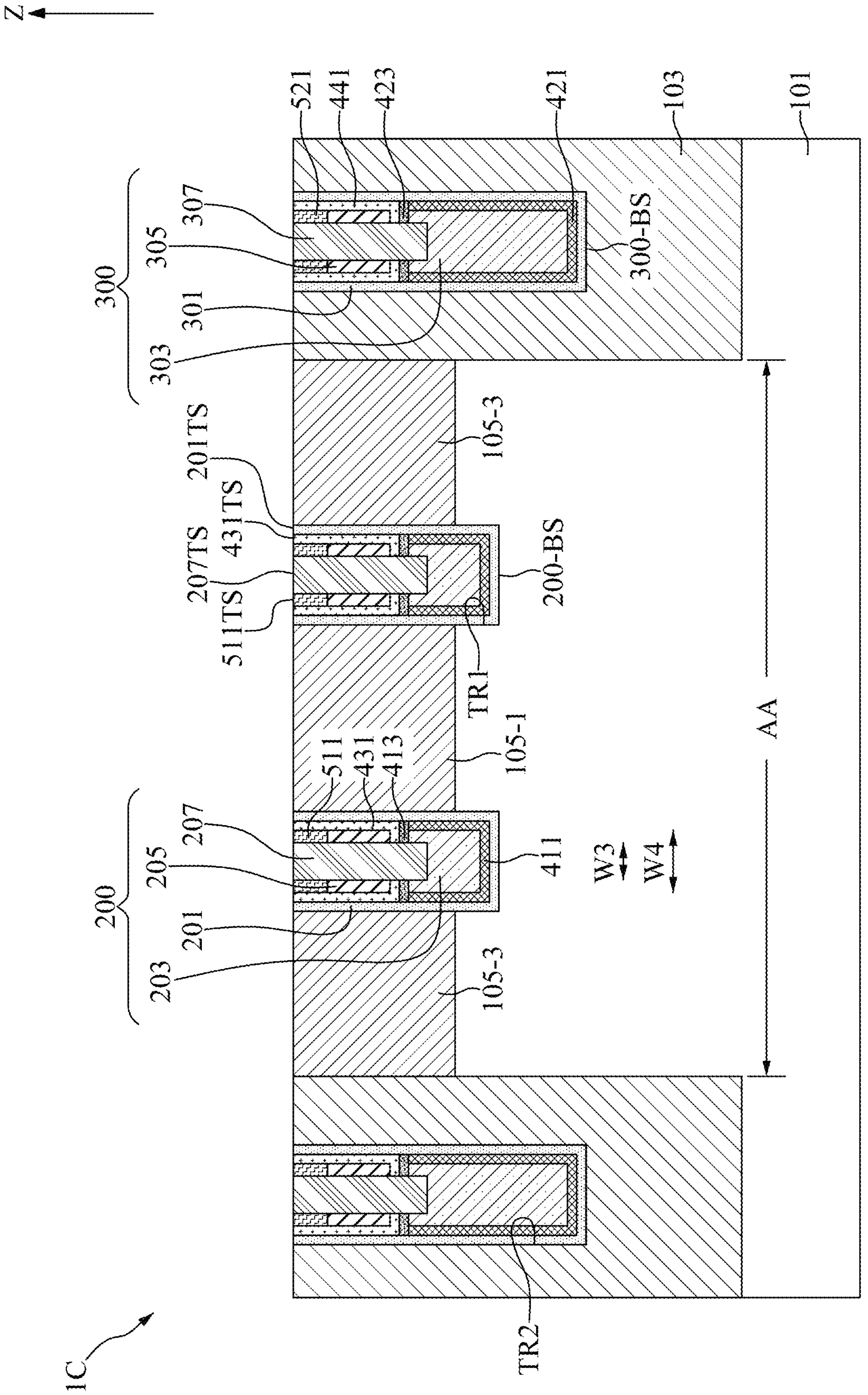

FIGS. 18 and 19 illustrate, in schematic cross-sectional view diagrams, part of a flow for fabricating a semiconductor device 1C in accordance with another embodiment of the present disclosure.

With reference to FIG. 18, an intermediate semiconductor device may be fabricated with a procedure similar to that illustrated in FIG. 13. The layer of capping material 751 may be formed to fill the first trench TR1 and the second trench TR2 with a procedure similar to that illustrated in FIG. 15, and descriptions thereof are not repeated herein. It should be noted that the plurality of first spacers 511 and the plurality of second spacers 521 are not removed before depositing of the capping material 751.

With reference to FIG. 19, a planarization process as illustrated in FIG. 16 may be performed, and descriptions thereof are not repeated herein. In semiconductor device 1C, the first capping layer 207 may have a line-shaped cross-sectional profile. The upper portion of the first capping layer 207 may be laterally surrounded by the plurality of first spacers 511. In some embodiments, the top surface 511TS of the plurality of first spacers 511, the top surface 207TS of the first capping layer 207, the top surface 431TS of the first thickening layer 431, and the top surface 201TS of the first word line dielectric layer 201 may be substantially coplanar. Likewise, the second capping layer 307 may feature a similar structure analogous to the first capping layer 207, and further details are not reiterated here for brevity. In some embodiments, the width ratio of the width W3 of the first capping layer 207 to the width W4 of the first bottom conductive layer 203 may be in between about 0.20 to about 0.80.

Figure 20:
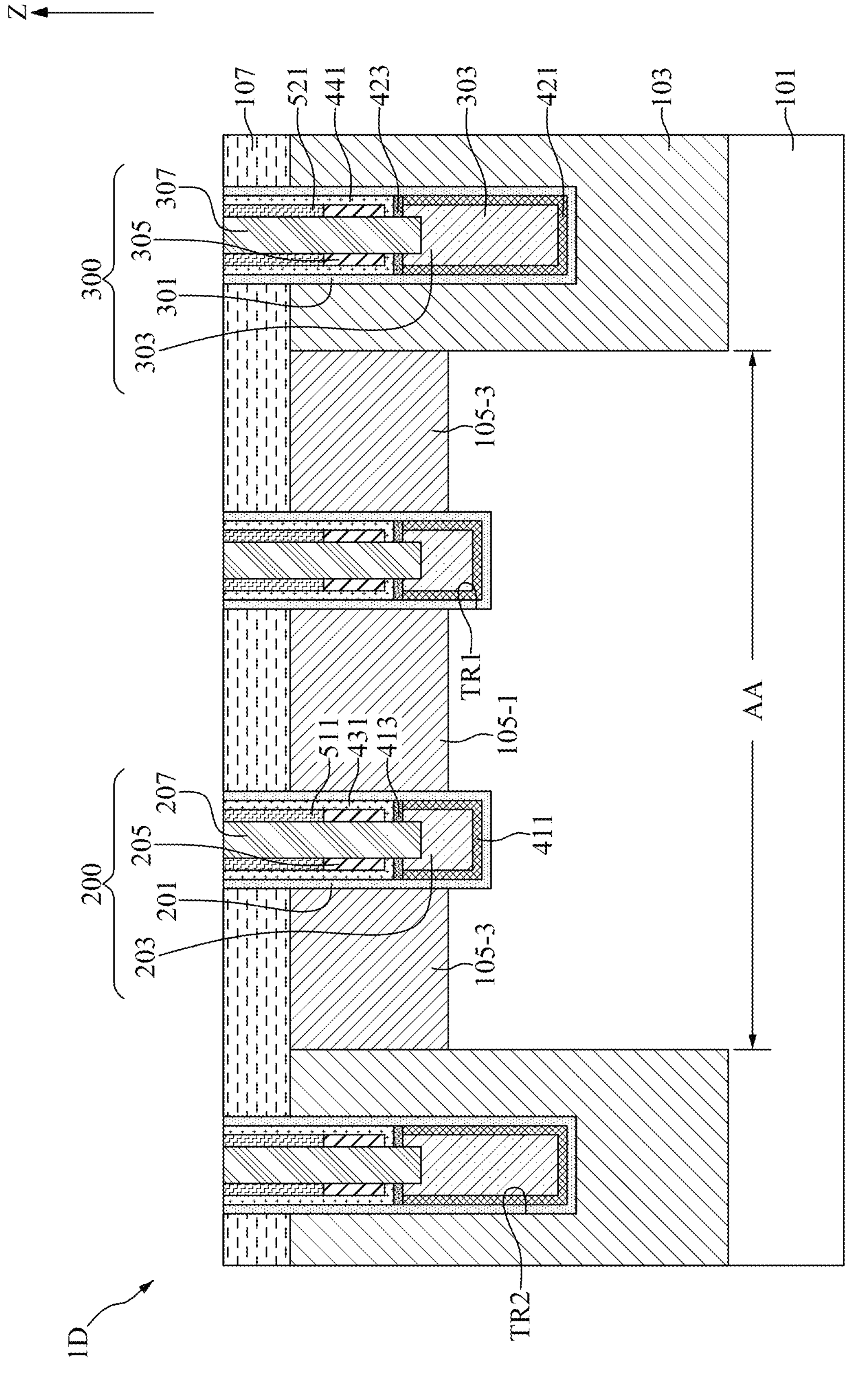
FIG. 20 illustrates, in a schematic cross-sectional view diagram, a semiconductor device in accordance with another embodiment of the present disclosure.

FIG. 20 illustrates, in a schematic cross-sectional view diagram, a semiconductor device 1D in accordance with another embodiment of the present disclosure.

With reference to FIG. 20, the semiconductor device 1D May have a structure similar to that illustrated in FIG. 19. The same or similar elements in FIG. 20 as in FIG. 19 have been marked with similar reference numbers and duplicative descriptions have been omitted.

For semiconductor device 1D, the planarization process as illustrated in FIG. 16 may be performed until the bottom dielectric layer 107 is exposed so that the bottom dielectric layer 107 may be intact or only partially removed. Therefore, the first word line dielectric layer 201 (or the second word line dielectric layer 301) may be laterally surrounded by the bottom dielectric layer 107. The first capping layer 207 (or the second capping layer 307) may be thicker along the direction Z compared to those illustrated in FIG. 19. The bottom dielectric layer 107 may serve as a buffer layer, a protection layer, or an etching stop layer for the following processes.

One aspect of the present disclosure provides a semiconductor device including a substrate; and a first word line structure including a first word line dielectric layer positioned in the substrate and including a U-shaped cross-sectional profile, a first bottom conductive layer positioned on the first word line dielectric layer and laterally surrounded by the first word line dielectric layer, a first top conductive layer positioned on the first bottom conductive layer and laterally surrounded by the first word line dielectric layer, and a first capping layer including a bottom portion positioned penetrating through the first top conductive layer and extending to the first bottom conductive layer, and a top portion positioned on the bottom portion and laterally surrounded by the first word line dielectric layer.

Another aspect of the present disclosure provides a semiconductor device including a substrate; a first word line dielectric layer positioned in the substrate and including a U-shaped cross-sectional profile; a first bottom conductive layer positioned on the first word line dielectric layer and laterally surrounded by the first word line dielectric layer; a first top conductive layer positioned on the first bottom conductive layer and laterally surrounded by the first word line dielectric layer; a first capping layer positioned penetrating the first top conductive layer and extending to the first bottom conductive layer; and a plurality of first spacers positioned on the first top conductive layer and laterally surrounding the first capping layer. The first word line dielectric layer, the first bottom conductive layer, the first top conductive layer, and the first capping layer together configure a first word line structure.

Another aspect of the present disclosure provides a method for fabricating a semiconductor device including providing a substrate and forming a first trench in the substrate, and conformally forming a layer of first dielectric material in the first trench; forming a first bottom conductive layer on the layer of first dielectric material and within the first trench, and forming a first top conductive layer on the first bottom conductive layer and within the first trench; conformally forming a layer of spacer material on the first top conductive layer and the layer of first dielectric material; performing a punch-through process to turn the layer of spacer material into a plurality of first spacers attached to the layer of first dielectric material, resulting in a first inner trench, which separates the plurality of first spacers and partially exposes the first top conductive layer; deepening the first inner trench to form a first extended inner trench that penetrates the first top conductive layer and extends to the first bottom conductive layer; removing the plurality of first spacers and forming a layer of capping material to completely fill the first trench; and performing a planarization process to turn the layer of first dielectric material into a first word line dielectric layer and turn the layer of capping material into a first capping layer. The first word line dielectric layer, the first bottom conductive layer, the first top conductive layer, and the first capping layer together configure a first word line structure.

Due to the design of the semiconductor device of the present disclosure, issues such as line end wiggling may be mitigated by substituting sections of the first top conductive layer 205 with the bottom portion 207-1 of the first capping layer 207. Additionally, gate-induced drain leakage may be minimized by utilizing the first bottom conductive layer 203 and the first top conductive layer 205 composed of materials with differing work functions. Furthermore, the integration of the first thickening layer 431 may increase the insulating capability of the first word line dielectric layer 201 by augmenting its thickness. This enhancement is particularly advantageous, considering that the word line dielectric layer 201 may be susceptible to depletion during processes like etching back or cleaning, which could otherwise exacerbate gate-induced drain leakage.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate; and a first word line structure comprising:

- a first word line dielectric layer positioned in the substrate and comprising a U-shaped cross-sectional profile;

- a first bottom conductive layer positioned on the first word line dielectric layer and laterally surrounded by the first word line dielectric layer;
- a first top conductive layer positioned on the first bottom conductive layer and laterally surrounded by the first word line dielectric layer; and
- a first capping layer comprising:
  - a bottom portion positioned penetrating through the first top conductive layer and extending to the first bottom conductive layer; and
  - a top portion positioned on the bottom portion and laterally surrounded by the first word line dielectric layer.

2. The semiconductor device of claim 1, wherein a width ratio of a width of the top portion to a width of the bottom portion is between about 4.0 and about 1.5.

3. The semiconductor device of claim 1, further comprising a first bottom barrier layer positioned between the first bottom conductive layer and the first word line dielectric layer.

4. The semiconductor device of claim 1, further comprising a first middle barrier layer positioned between the first bottom conductive layer and the first top conductive layer, wherein the bottom portion penetrates through the first middle barrier layer.

5. The semiconductor device of claim 1, further comprising a first thickening layer positioned between the first top conductive layer and the first bottom conductive layer, between the first top conductive layer and the first word line dielectric layer, and between the top portion and the first word line dielectric layer, wherein the bottom portion penetrates through the first thickening layer.

6. The semiconductor device of claim 2, wherein the first word line dielectric layer comprises a high-k dielectric material.

7. The semiconductor device of claim 2, wherein the first bottom conductive layer comprises tungsten, cobalt, zirconium, tantalum, aluminum, ruthenium, copper, metal carbides, transition metal aluminides, or a combination thereof.

8. The semiconductor device of claim 2, wherein the first top conductive layer comprises polycrystalline silicon, polycrystalline germanium, polycrystalline silicon germanium, doped polycrystalline silicon, doped polycrystalline germanium, doped polycrystalline silicon germanium, or a combination thereof.

9. The semiconductor device of claim 3, wherein the first bottom barrier layer comprises titanium nitride.

10. The semiconductor device of claim 4, wherein the first middle barrier layer comprises titanium nitride, titanium, or a combination thereof.

11. The semiconductor device of claim 5, wherein the first thickening layer and the first capping layer comprise the same material.

12. The semiconductor device of claim 5, wherein the first thickening layer comprises silicon oxide.

* * * * *